United States Patent
Hsu et al.

(10) Patent No.: US 12,029,140 B2
(45) Date of Patent: Jul. 2, 2024

(54) QUANTUM BIT ARRAY

(71) Applicants: Fu-Chang Hsu, San Jose, CA (US); Kevin Hsu, San Jose, CA (US)

(72) Inventors: Fu-Chang Hsu, San Jose, CA (US); Kevin Hsu, San Jose, CA (US)

(*) Notice: Subject to any disclaimer, the term of this patent is extended or adjusted under 35 U.S.C. 154(b) by 0 days.

(21) Appl. No.: 18/365,936

(22) Filed: Aug. 4, 2023

(65) Prior Publication Data

US 2024/0130249 A1    Apr. 18, 2024

Related U.S. Application Data

(63) Continuation of application No. 17/209,107, filed on Mar. 22, 2021, now Pat. No. 11,723,288.

(60) Provisional application No. 62/992,989, filed on Mar. 22, 2020.

(51) Int. Cl.
| | |
|---|---|
| H10N 60/10 | (2023.01) |
| G06N 10/00 | (2022.01) |
| H03K 3/38 | (2006.01) |
| H10N 69/00 | (2023.01) |

(52) U.S. Cl.
CPC ............. H10N 60/11 (2023.02); G06N 10/00 (2019.01); H03K 3/38 (2013.01); H10N 60/128 (2023.02); H10N 69/00 (2023.02)

(58) Field of Classification Search
CPC .................................................... H10N 60/11
USPC .......................................................... 327/528
See application file for complete search history.

(56) References Cited

U.S. PATENT DOCUMENTS

| | | | |
|---|---|---|---|
| 7,830,695 | B1 | 11/2010 | Moon |
| 2012/0280208 | A1 | 11/2012 | Jain |
| 2016/0087212 | A1 | 3/2016 | Klein |
| 2016/0125311 | A1* | 5/2016 | Fuechsle ............... H10N 60/80 257/31 |
| 2018/0226451 | A1 | 8/2018 | Dzurak et al. |
| 2018/0301381 | A1 | 10/2018 | Bi et al. |

FOREIGN PATENT DOCUMENTS

| | | |
|---|---|---|
| JP | 2009-16767 | 1/2009 |
| JP | 2013-214729 | 10/2013 |
| JP | 2017-508277 | 3/2017 |

(Continued)

OTHER PUBLICATIONS

International Search Report, dated Jun. 8, 2021, for corresponding International Application No. PCT/US2021/023534 (2 pages).

(Continued)

*Primary Examiner* — Tomi Skibinski
(74) *Attorney, Agent, or Firm* — Intellectual Property Law Group LLP

(57) ABSTRACT

A quantum bit array is disclosed. In an embodiment, the quantum bit array includes a control gate coupled to a qubit and at least one pass gate coupled between the qubit and an adjacent qubit to control operation of the qubit of the quantum bit array, a bit line, and a first transistor channel that connects the bit line to the control gate. The array further comprises at least one word line coupled to the first transistor channel. The at least one word line selectively controls charge flow through the first transistor channel. The array further comprises a capacitor coupled to selectively store charge in the first transistor channel.

8 Claims, 22 Drawing Sheets

(56) References Cited

FOREIGN PATENT DOCUMENTS

| JP | 2018-532255 | 11/2018 |
|----|-------------|---------|
| WO | WO 2017/020095 A1 | 2/2017 |
| WO | WO 2017/150980 A1 | 9/2017 |
| WO | WO 2018/236404 A1 | 12/2018 |
| WO | WO 2019/004990 A1 | 1/2019 |
| WO | WO 2019/066843 A1 | 4/2019 |

OTHER PUBLICATIONS

Written Opinion of the International Searching Authority, dated Jun. 8, 2021, for corresponding International Application No. PCT/US2021/023534 (6 pages).
First Examination Report, dated Jan. 24, 2023, for corresponding India Application No. 202227059540 (7 pages).
Japan Office Action, dated Dec. 18, 2023, for corresponding Japan Application No. 2023-501331, with English translation (16 pages).
Extended European Search Report, dated Apr. 4, 2024, for corresponding European Application No. 1776277.2 (14 pages).
Veldhorst et al., "Silicon CMOS architecture for a spin-based quantum computer", Nature Communications, vol. 8, Article No. 1766 (2017), pp. 1-8, (8 pages).
Li et al., "A Crossbar Network for Silicon Quantum Dot Qubits", arxiv.org, Cornell University Library, submitted on Nov. 10, 2017, pp. 1-24 (also published in Science Advances, Jul. 6, 2018, vol. 4, Issue 7), (24 pages).

* cited by examiner

QUANTUM BIT ARRAY

CROSS-REFERENCE TO RELATED APPLICATIONS

This Application is a continuation of co-pending U.S. patent application Ser. No. 17/209,107, filed on Mar. 22, 2021, and entitled "QUANTUM BIT ARRAY", which claims the benefit under 35 U.S.C. § 119 of U.S. Provisional Patent Application No. 62/992,989 filed on Mar. 22, 2020 and entitled "QUANTUM BIT ARRAY," each of which is incorporated by reference herein in its entirety.

FIELD OF THE INVENTION

The exemplary embodiments of the present invention relate generally to the field of semiconductors and integrated circuits, and more specifically to the design and operation of Quantum bit arrays.

BACKGROUND OF THE INVENTION

In quantum computing, a qubit or quantum bit is the basic unit of quantum information. A qubit is a two-state (or two-level) quantum-mechanical system. Examples include the spin of an electron in which the two levels can be taken as spin up and spin down, or the polarization of a single photon in which the two states can be taken to be the vertical polarization and the horizontal polarization. Quantum mechanics allows the qubit to be in a coherent superposition of both states simultaneously, a property which is fundamental to quantum computing.

A quantum bit array comprises a large number of qubits. Since the qubits are very small they can be spaced very closely together in the array. This has the potential to allow very large and powerful quantum bit arrays to be constructed. However, limitations exist in the control structures used to access the qubits in a quantum bit array.

SUMMARY

In various exemplary embodiments, a quantum bit ('qubit') array is provided. The array includes control structures that can be used to access the qubits in the array to allow very small spacing and very large and powerful quantum bit arrays to be constructed.

In an embodiment, the quantum bit array is provided that includes a control gate coupled to a qubit and at least one pass gate coupled between the qubit and an adjacent qubit to control operation of the qubit of the quantum bit array, a bit line, and a first transistor channel that connects the bit line to the control gate. The array further comprises at least one word line coupled to the first transistor channel. The at least one word line selectively controls charge flow through the first transistor channel. The array further comprises a capacitor coupled to selectively store charge in the first transistor channel.

In an embodiment, a method for operating a quantum array is provided. The method comprises the operations of applying one or more first voltages to one or more Y-direction word lines that are coupled to at least one vertical transistor, respectively, and applying one or more second voltages to one or more X-direction word lines that are coupled to the at least one vertical transistor, respectively. The method also comprises the operations of applying a third voltage to a capacitor that is coupled to the at least one vertical transistor, and applying one or more bit line voltages to the at least one vertical transistor to control operations of a qubit of the quantum array.

Additional features and benefits of the present invention will become apparent from the detailed description, figures and claims set forth below.

BRIEF DESCRIPTION OF THE DRAWINGS

The exemplary embodiments of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

In various exemplary embodiment, methods and apparatus are provided for the design, construction, and operation Quantum bit arrays. The embodiments can be applied to any suitable quantum technologies, including but not limited to technologies using qubits such as atoms, photons, electrons, nucleus, ions, optical lattices, Josephson junctions, quantum dots, quantum dot pairs, etc. Moreover, the application of the disclosed Quantum bit array structures are not limited to quantum bit arrays, but can be applied to other technologies, such as magnetic memory.

Those of ordinary skilled in the art will realize that the following detailed description is illustrative only and is not intended to be in any way limiting. Other embodiments of the present invention will readily suggest themselves to such skilled persons having the benefit of this disclosure. Reference will now be made in detail to implementations of the exemplary embodiments of the present invention as illustrated in the accompanying drawings. The same reference indicators (or numbers) will be used throughout the drawings and the following detailed description to refer to the same or like parts.

Figure 1:
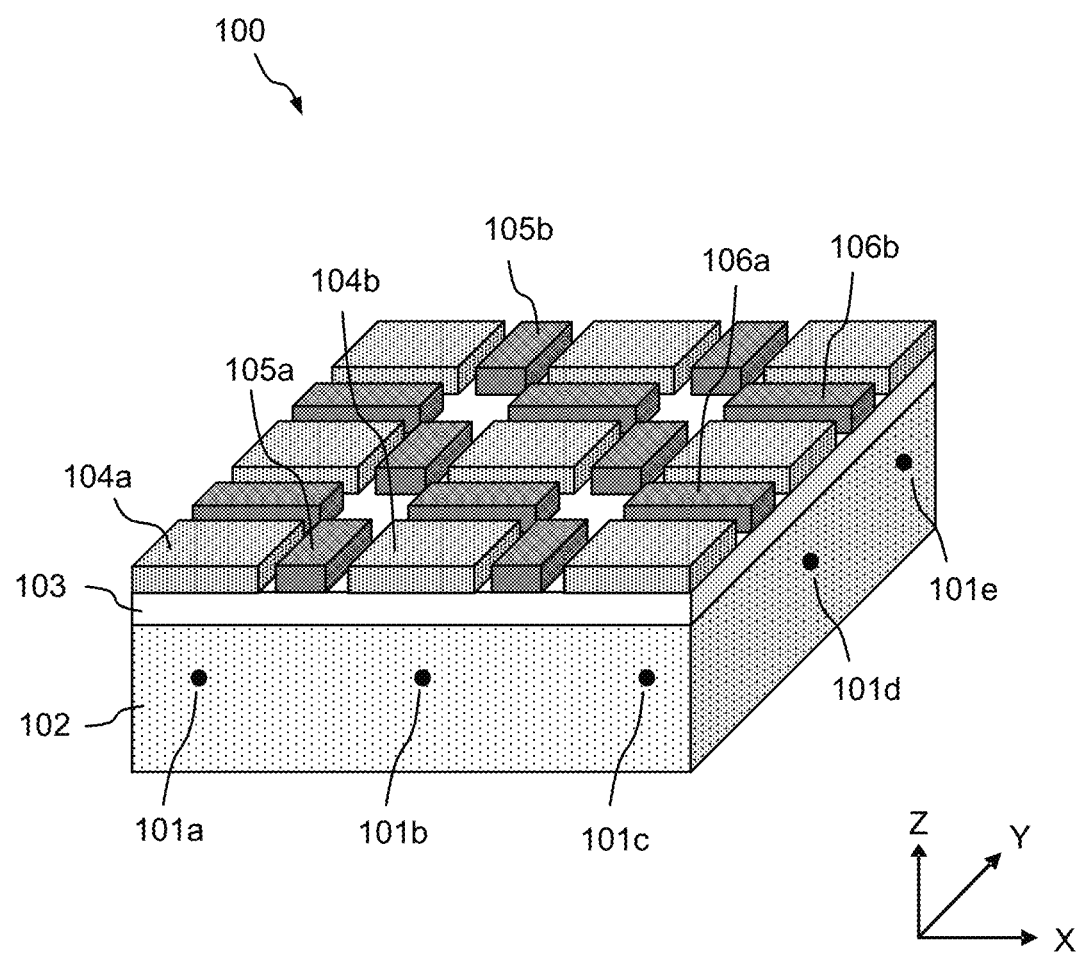
FIG. 1 shows a lower structure of a quantum bit array.

FIG. 1 shows a lower structure of a quantum bit array (QBA) 100. The QBA 100 comprises quantum bits 101a-e, which are also referred to as "qubits." In an embodiment, the qubits 101a-e are formed by implanting one or multiple atoms of a donor material, such as phosphorus, into a silicon substrate 102. Each qubit has a control gate 104, such as the control gates 104a-b. A dielectric layer 103 or barrier layer, such as an oxide, is located above the qubits and between the silicon substrate 102 and the control gates 104. Each control gate 104 is coupled to control a corresponding qubit to perform read, write, or other logic operations.

The data of a qubit is represented by its 'quantum state'. The qubit may be read from or written to in many ways. A typical approach is to apply radio frequencies (RF) or magnetic fields through the control gates 104 to sense or switch the quantum state of a selected qubit. Moreover, a selected control gate can be supplied with a voltage to attract or repel the electron of the associated qubit to initialize the quantum state of that qubit.

The QBA 100 also comprises X-direction pass gates 105, such as pass gates 105a-b, and Y-direction pass gates 106, such as pass gates 106a-b. When an X-direction pass gate, such as pass gate 105a is turned on, it will 'entangle' the adjacent X-direction qubits 101a-b to perform a 'logic operation' or 'calculation' between those qubits. Similarly, when a Y-direction pass gate, such as pass gate 106b is turned on, it will entangle the adjacent Y-direction qubits 101d-e to perform a logic operation or calculation between those qubits.

It should be noted that in quantum computing, the distance between adjacent qubits is an important consideration. The distance cannot be too far, or the qubits will not entangle. Typically, the maximum distance between the qubits is about 20 nanometers (nm). Because the control gates 104, X-direction pass gates 105, and Y-direction pass gates 106 need to be individually controlled, all the gates may be connected to decoder circuits. As a result, it is very challenging to integrate so many decoder circuits into a qubit array with such closely spaced qubits. In various exemplary embodiments, methods and apparatus are disclosed herein to design, select and control the control gates and pass gates of a qubit array.

Figure 2A:
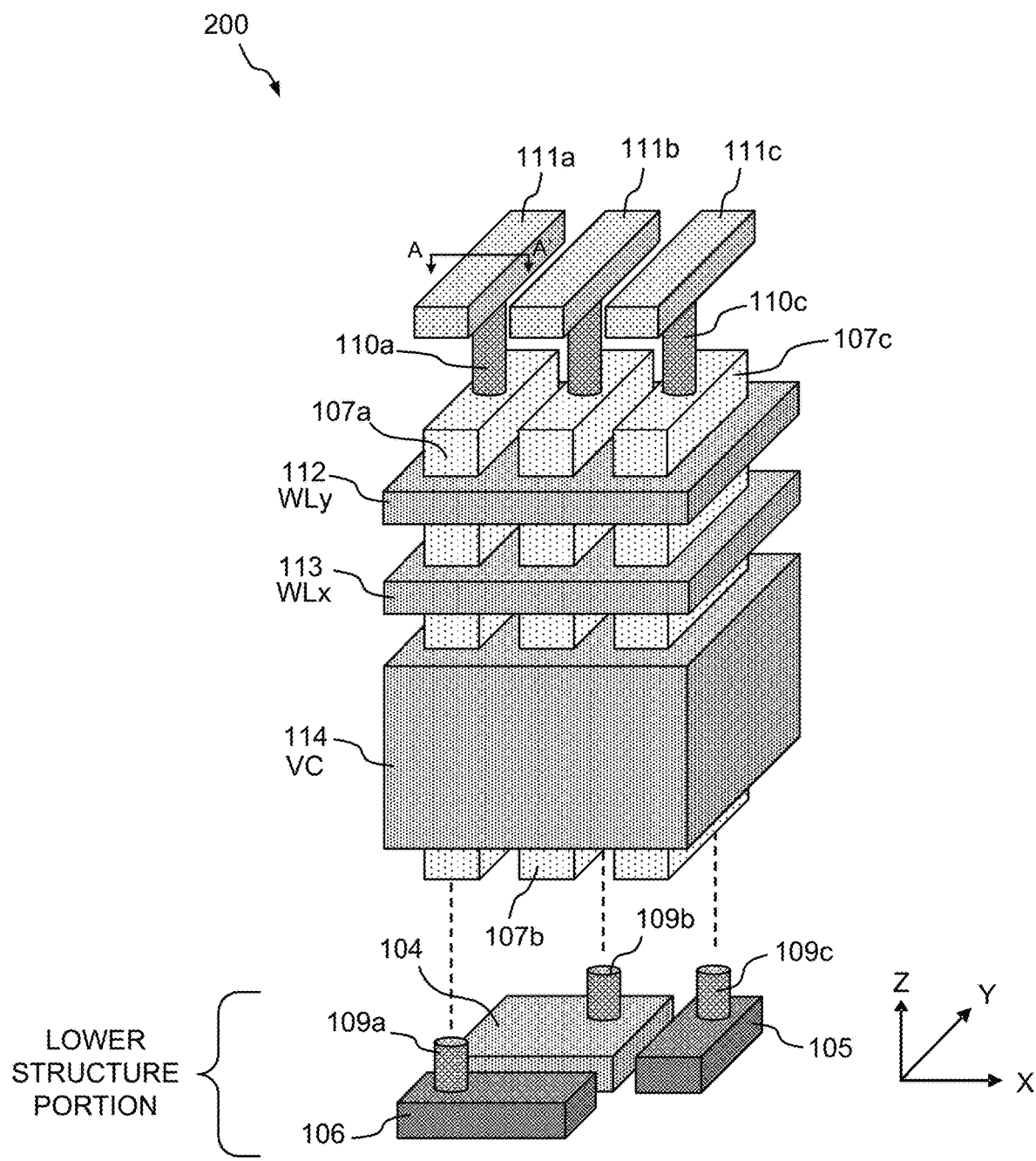
FIG. 2A shows an exemplary embodiment of a basic unit of a qubit array constructed in accordance with aspects of the invention.

FIG. 2A shows an exemplary embodiment of a basic unit of a qubit array 200 constructed in accordance with aspects of the invention. As illustrated in FIG. 2A, the array 200 is built upon the lower structure shown in FIG. 1. For simplicity and clarity, only a portion of the lower structure is shown in FIG. 2A. The basic unit shown in FIG. 2A can be replicated multiple times and combined to form a much larger qubit array. The array 200 comprises the control gate 104, X-direction pass gate 105, and Y-direction pass gate 106, which are also shown in the lower structure 100 shown in FIG. 1. The array 200 also comprises silicon or polysilicon channels of three vertical transistors 107a-c. The drains of the vertical transistors 107 are connected to the control gate 104 and X-direction 105 and Y-direction 106 pass gates, respectively, through corresponding contacts 109a-c. In another embodiment, the drains of the vertical transistors 107 are directly connected to the control gate 104 and X-direction 105 and Y-direction 106 pass gates without the contacts 109a-c. The sources of the vertical transistors 107 are connected to bit lines 111a-c through corresponding contacts 110a-c. The bit lines 111 are made of conductors, such as metal or polysilicon.

The vertical transistors 107 are coupled to three conductors 112, 113, and 114, which comprise material, such as metal or polysilicon. The first conductor 112 is connected to a Y-direction word line (WLy) and forms a first gate that selectively controls the current flow through the transistors 107a-c. The second conductor 113 is connected to an X-direction word line (WLx) and forms a second gate that selectively controls the current flow through the transistors 107a-c. In another embodiment, the connections of the WLx and WLy word lines to the conductors are exchanged. The word lines WLx and WLy allow selection and operation of one basic unit of the qubit array by selectively allowing current flow through the transistors 107a-c. The transistors 107a-c connect the control gate 104 and pass gates 105/106 to the bit lines 111b, 111c, and 11a, respectively. In an embodiment, an external programming circuit can control the selected unit's control gate 104 and pass gates 105/106 through the bit lines 111a-c to perform read, write, or other logic operations.

Figure 3A:
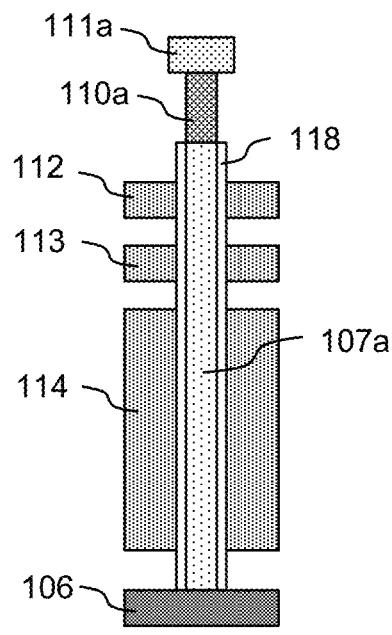
FIG. 3A-D shows cross-sectional views of embodiments of the basic unit shown in FIG. 2A.

The third conductor 114 forms a third gate or a "capacitor" gate. In an embodiment, the conductor 114 is connected to a voltage source (VC) to turn on the channels of the transistors 107a-c. Thus, the third conductor 114 forms MOS capacitors as described with reference to the cross-section views shown in FIGS. 3A-D. For example, the detailed structure of the MOS capacitor is similar to a planar MOS capacitor except it uses a vertical transistor. Referring now to FIG. 3A, the conductor 114 forms the first conductive plate of the capacitor. Additionally, a gate dielectric layer 118 is shown. The channel under the dielectric layer 118 forms the second conductive plate of the capacitor. During operation, the voltage passed to the channel can be held by the capacitor.

Referring again to FIG. 2A, the conductor 114 is configured to couple to the transistors 107a-c over a selected length channel to increase the channel capacitance. Therefore, when WLx 113 and WLy 112 select one unit of the Quantum array, the bit line voltages of the selected unit pass through the channel of the capacitor gate 114 and flow to the control gate 104 and pass gates 105/106. When WLx 113 and WLy 112 deselect the unit, the voltages of the control gate 104 and pass gates 105/106 will be held or maintained by the channel capacitance of the capacitor gate 114. Then, the next basic unit can be selected to load voltages to the control gate and pass gates of that next unit. By using this process, multiple basic units can be selected and loaded with the desire voltages to perform the desired operations. Moreover, the capacitor gate 114 also prevents the voltages of the control gate 104 and the pass gates 105/106 from being disturbed by the noise or coupling from the adjacent array units.

The embodiment of the basic unit of the QBA 200 shown in FIG. 2A is suitable for random bit-select, row-select, or column-select operations. For random bit-selection, the basic unit is selected by both word lines WLx 113 and WLy 112. For row-selection, the Y-direction word lines WLy 112 of multiple units may be turned on together. Then, one row of the units may be selected by the X-direction word line, WLx 113. Similarly, for column-selection, the X-direction word lines WLx 113 of multiple units may be turned on together. Then, one column of the units may be selected by the Y-direction word line, WLy 112.

The structure of the basic unit 200 disclosed in FIG. 2A only requires three vertical transistors 107a-c to control the control gate 104 and pass gates 105/106 of a qubit. Thus, by replicating this structure, a very high-density qubit array can be realized.

In another embodiment, if a qubit array only requires row-select or column-select operations, the basic unit structure shown in FIG. 2A can be configured to include only the WLx 113 or the WLy 112 as needed. Also notice, in FIG. 2A, the connections to the WLy 112 and the WLx 113 can be exchanged so that the WLy 112 becomes X-direction word line and the WLx 113 becomes Y-direction word line.

Figure 2B:
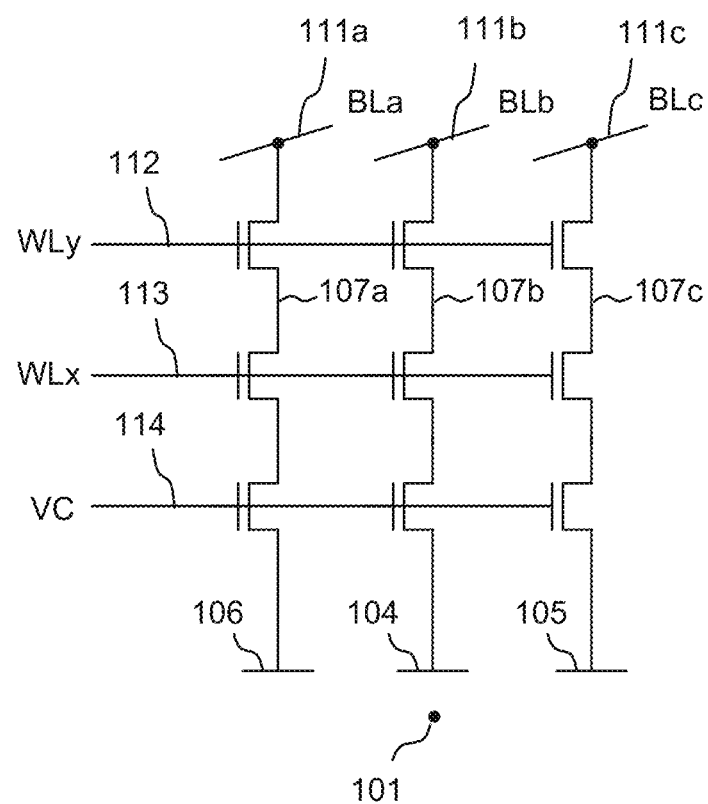
FIG. 2B shows an equivalent circuit of the basic unit shown in FIG. 2A.

FIG. 2B shows an equivalent circuit of the basic unit 200 shown in FIG. 2A. The circuit shown in FIG. 2B illustrates the connections of the bit lines 111a-c to the control gate 104, X-direction pass gate 105, and Y-direction pass gate 106. The qubit 101 is located under the control gate 104. The circuit also shows gates that are formed at the intersections of the transistor channels 107a-c and the WLy 112, WLx 113, and VC 114 conductors.

Figure 2C:
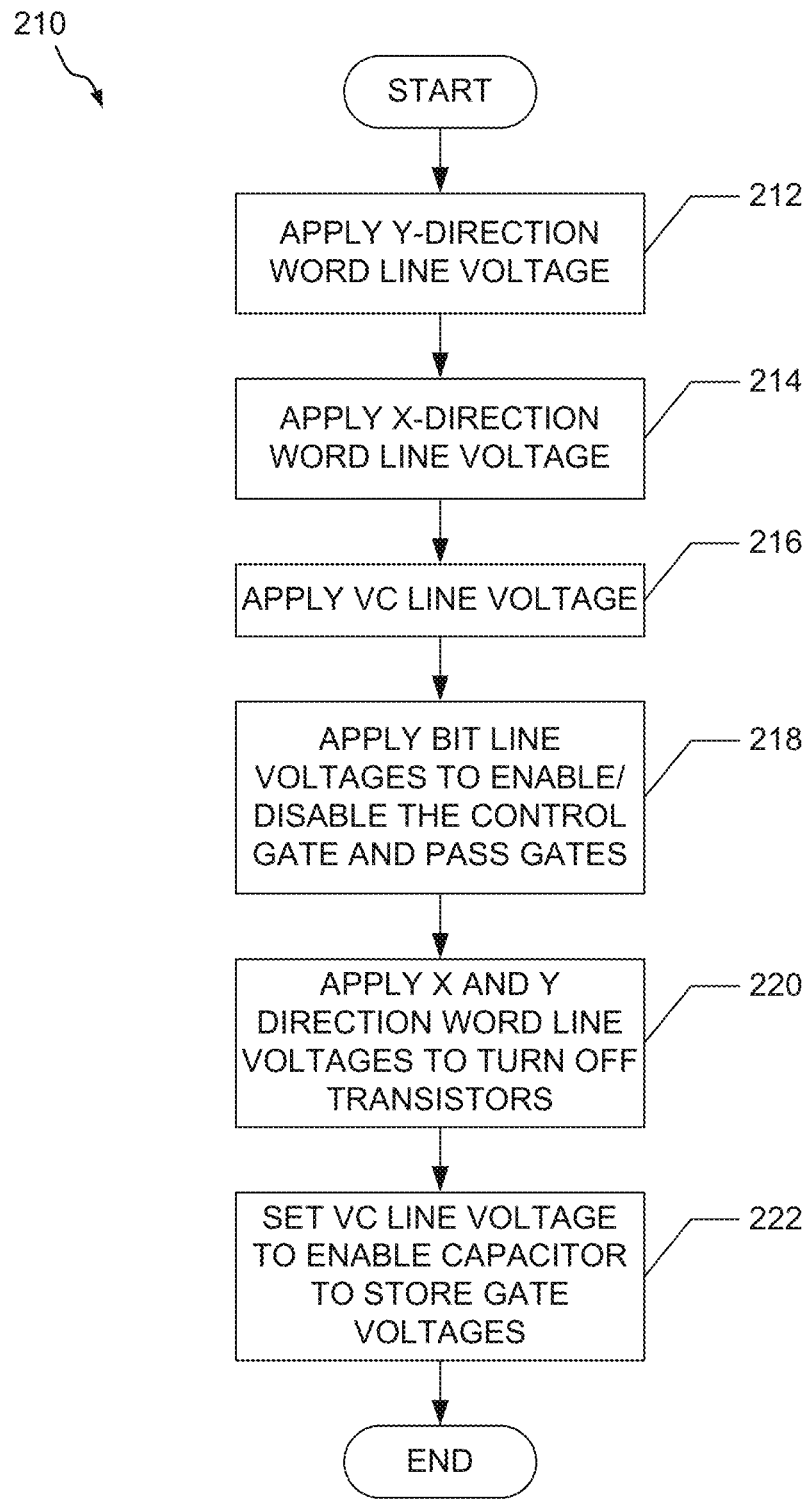
FIG. 2C shows an exemplary embodiment of a method for operating a qubit array.

FIG. 2C shows an exemplary embodiment of a method 210 for operating a qubit array. For example, the method 210 is suitable for use to operate the array 200 shown in FIG. 2A.

At block 212, a Y-direction word line voltage is applied. For example, a voltage is applied to WLy 112 to enable current to flow through the transistors 107a-c.

At block 214, an X-direction word line voltage is applied. For example, a voltage is applied to WLx 113 to enable current to flow through the transistors 107a-c.

At block 216, a VC line voltage is applied. For example, a voltage is applied to VC 114 to enable current to flow through the transistors 107a-c.

At block 218, bit line voltages are applied to enable/disable the control gate 104 and pass gates 105/106. For example, when the WLy 112, WLx 113, and VC 114 lines are set to allow current to flow through the transistors 107, the bit lines 111a-c are connected to the control gate 104 and the pass gates 105/106. Thus, the bit line voltages will be applied to those gates to control the operation of the qubit 101.

At block 220, X-direction and Y-direction word lines voltages are applied to turn off the vertical transistors. For example, the X-direction word line WLx 113 and the Y-direction word line WLy 112 are supplied with the appropriate voltages to turn off the transistors 107a-c.

At block 222, the VC line voltage is set to enable the capacitor to store the control gate 104 voltage and the pass gate 105/106 voltages. Thus, the previous bit line voltages applied to the control gate 104 and the pass gates 105/106 will be maintained.

After maintaining the control gate 104 and the pass gates 105/106 voltages for the current unit, another unit can be selected by applying the appropriate voltages to the WLy 112 and WLx 113. The voltages on the bit lines 111a-c can then be applied to the control gate and pass gates of that next unit.

Thus, the method 210 performs operations to control a qubit array. It should be noted that the operations of the method 210 could be combined, added to, deleted, rearranged, or otherwise modified within the scope of the embodiments.

FIG. 3A shows a cross-sectional view of an embodiment of the basic unit 200 taken along cross-section indicator A-A' shown in FIG. 2A. In an embodiment, the silicon or polysilicon transistor channel 107a includes a gate dielectric layer 118 that comprises material, such as an oxide or high-K material. In the embodiment shown in FIG. 3A, the basic unit 200 includes a "junction-less" transistor that has no source or drain junctions. Thus, the source of the transistor channel 107a is directly connected to the pass gate 106.

Figure 3B:
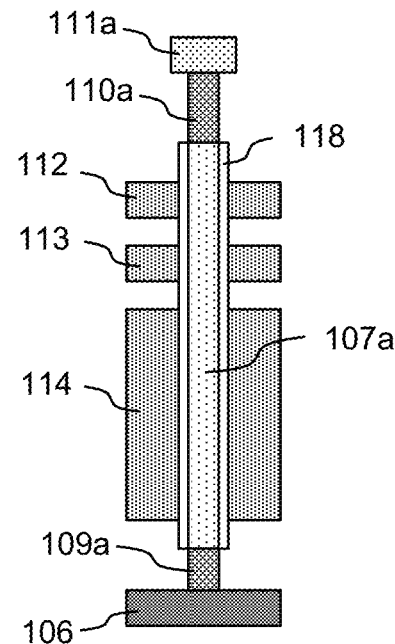

FIG. 3B shows a cross-sectional view of another embodiment of the basic unit 200 taken along the cross-section indicator A-A' shown in FIG. 2A. In the embodiment shown in FIG. 3B, the source of the transistor channel 107a is connected to the pass gate 106 through the contact 109a.

Figure 3C:
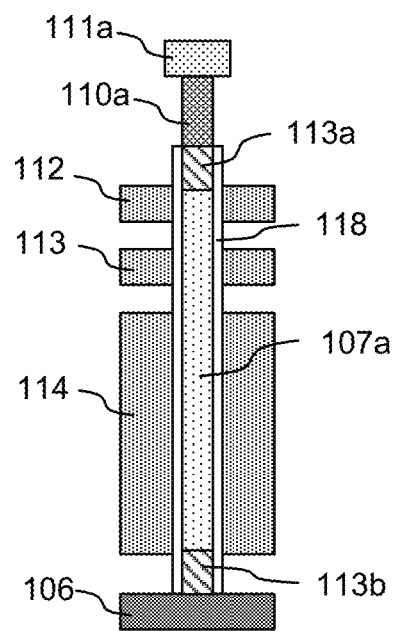

FIG. 3C shows a cross-sectional view of another embodiment of the basic unit 200 taken along the cross-section indicator A-A' shown in FIG. 2A. In the embodiment shown in FIG. 3C, the transistor channel 107a includes a source junction 113a and a drain junction 113b. In one embodiment, the junctions 113a and 113b have the same type of doping as the transistor channel 107a. In this case, the transistor channel 107a functions as a junction-less transistor. In another embodiment, the junctions 113a and 113b have the opposite type of doping from the transistor channel 107a. In this case, the transistor channel 107a functions as a traditional junction transistor.

Figure 3D:
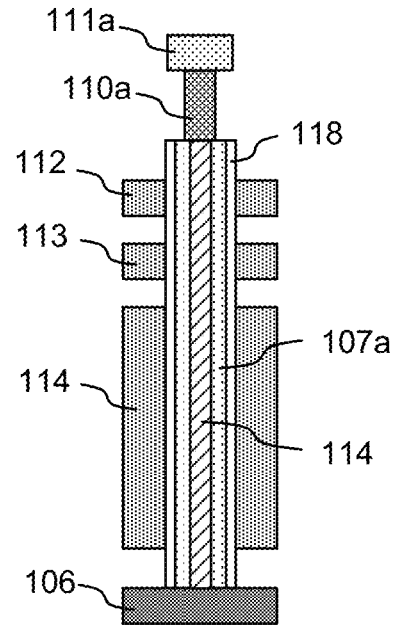

FIG. 3D shows a cross-sectional view of another embodiment of the basis unit 200 taken along the cross-section indicator A-A' shown in FIG. 2A. In the embodiment shown in FIG. 3D, the transistor channel 107a includes an insulating core 114 in the center of the channel silicon 107a. In this configuration, the diameter of the transistor channel 107a is relaxed to reduce the manufacturing cost, while the thickness of the channel 107a is maintained within the requirements for a junction-less transistor.

In the embodiments shown in FIGS. 2A-3D, the word lines WLx 113 and WLy 112 select one basic unit of the qubit array. The selected unit's control gate 104 and pass gates 105/106 are selectively connected to the bit lines together. The embodiments do not allow for individual control of the connections of the control gate and pass gates to the bit lines.

Figure 4A:
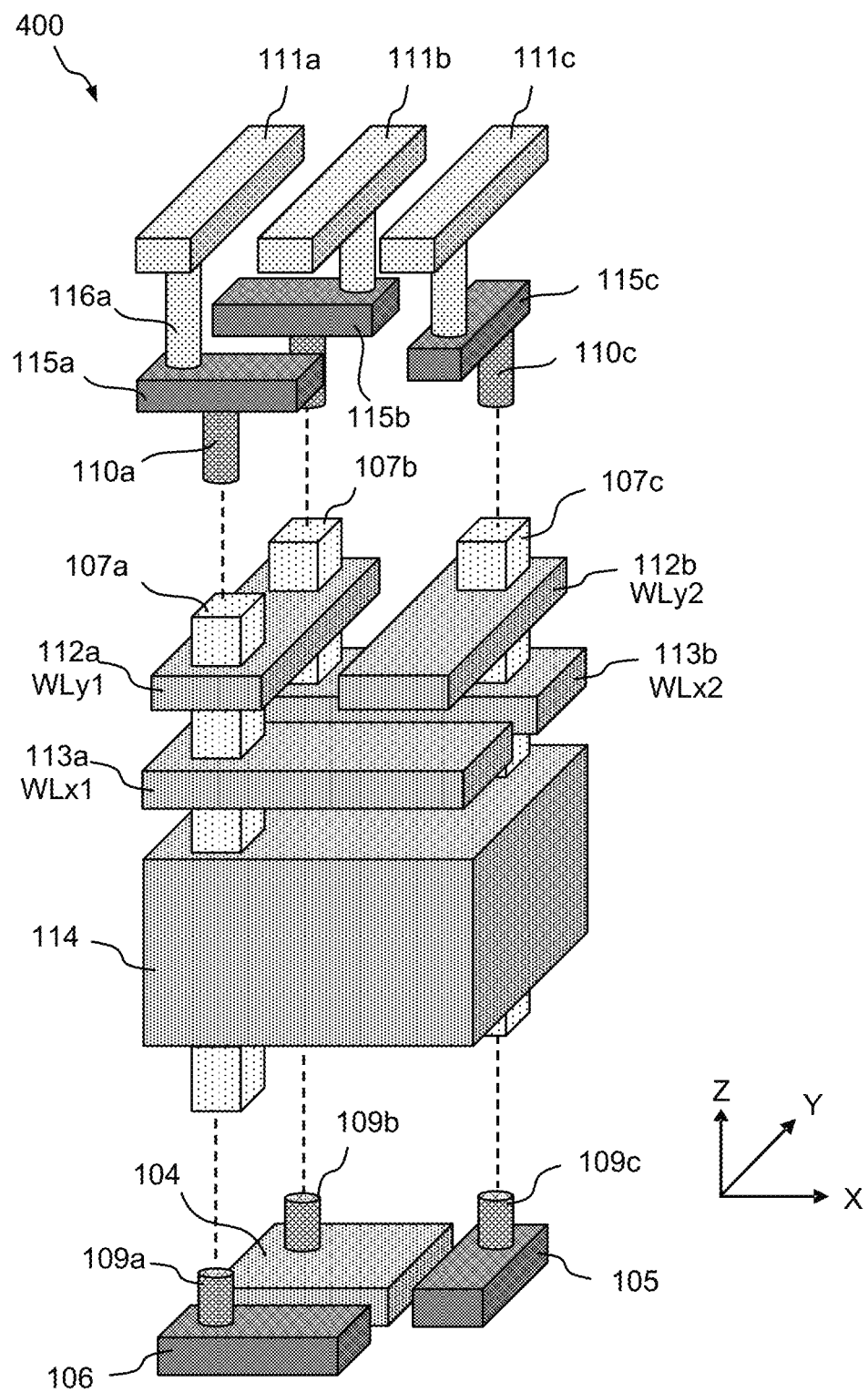
FIG. 4A shows an exemplary embodiment of a basic unit of a qubit array.

FIG. 4A shows an exemplary embodiment of a basic unit of a qubit array 400. This embodiment provides for individual control of the connections between the bit lines 111a-c and the control gate 104 and the pass gates 105 and 106. The individual control is achieved by using the word lines 112a, 112b, 113a, and 113b to selectively connect the bit lines 111a-c to the control gate 104 and pass gates 105/106.

In the embodiment shown in FIG. 4A, each basic unit has two X-direction word line conductors (e.g., WLx1 113a and WLx2 113b) and two Y-direction word line conductors (e.g., WLy1 112a and WLy2 112b). The vertical transistor channels 107a-c intersect with the X-direction word lines and the Y-direction word lines as shown. For example, the channel 107a intersects with the WLy1 112a and WLx1 113a. The channel 107b intersects with WLy1 112a and WLx2 113b. The channel 107c intersects with WLy2 112b and WLx2 113b.

During operation, when WLx1 113a and WLy1 112a are selected, the pass gate 106 is connected to the bit line 11a. When WLx2 113b and WLy1 112a are selected, the control gate 104 is connected to the bit line 111b. When WLx2 113b and WLy2 112b are selected, the pass gate 105 is connected to the bit line 111c. Using this process, individual connections between the bit lines and the control gate and the pass gates can be realized by selecting the appropriate two word lines.

Thus, it is possible to connect any combination of the control gate and pass gates to the bit lines by making multiple word line selections. For example, to connect the control gate 104 and the pass gate 106 to their associated bit lines, three word lines are selected. When WLx1, WLx2, and WLy1 are selected, the control gate 104 and pass gate 106 are connected to their associated bit lines. When WLx2, WLy1, and WLy2 are selected, the control gate 104 and the pass gate 105 are connected to their associated bit lines. When WLx1, WLx2, WLy1, and WLy2 are selected, the control gate 104 and pass gates 105/106 are connected to their associated bit lines.

In this embodiment, the source of the transistors 107a, 107b, and 107c may be located in a position that cannot be directly connected to the bit lines 111a, 111b, and 111c, as shown. For example, because the node 107b is under the bit line 11a and cannot be directly connected to the bit line 111b with a vertical contact, a metal layer 115b is used to 'twist' or adapt the position of the contact 107b so that the bit line voltage can flow from 111b to 115b and then to 107b. Therefore, an interconnect layer 115a, 115b, and 115c, comprising material such as metal or polysilicon, can be used to connect the source of the transistors to the bit lines.

Figure 4B:
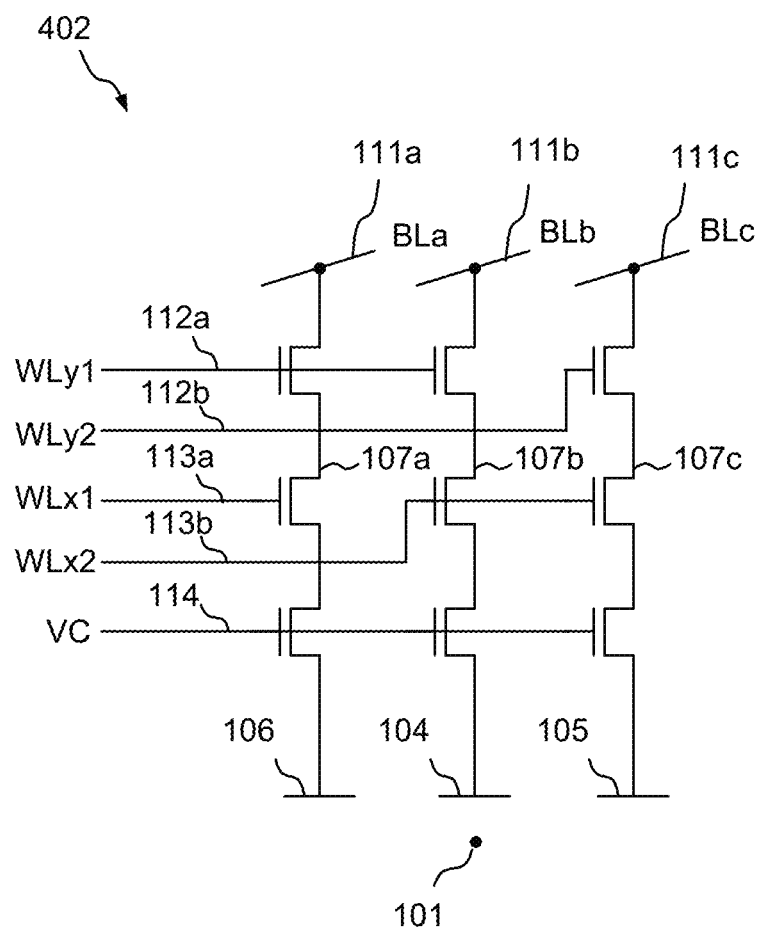
FIG. 4B shows an equivalent circuit of the basic unit shown in FIG. 4A.

FIG. 4B shows an equivalent circuit of the basic unit 400 shown in FIG. 4A. The circuit shown in FIG. 4B illustrates the connections of the bit lines 111a-c to the control gate 104, X-direction pass gate 105, and Y-direction pass gate 106. The qubit 101 is located under the control gate 104. The circuit also shows gates that are formed at the intersections of the transistor channels 107a-c and the WLy1 112a, WLy2 112b, WLx1 113a, and WLx2 113b conductors.

Figure 4C:
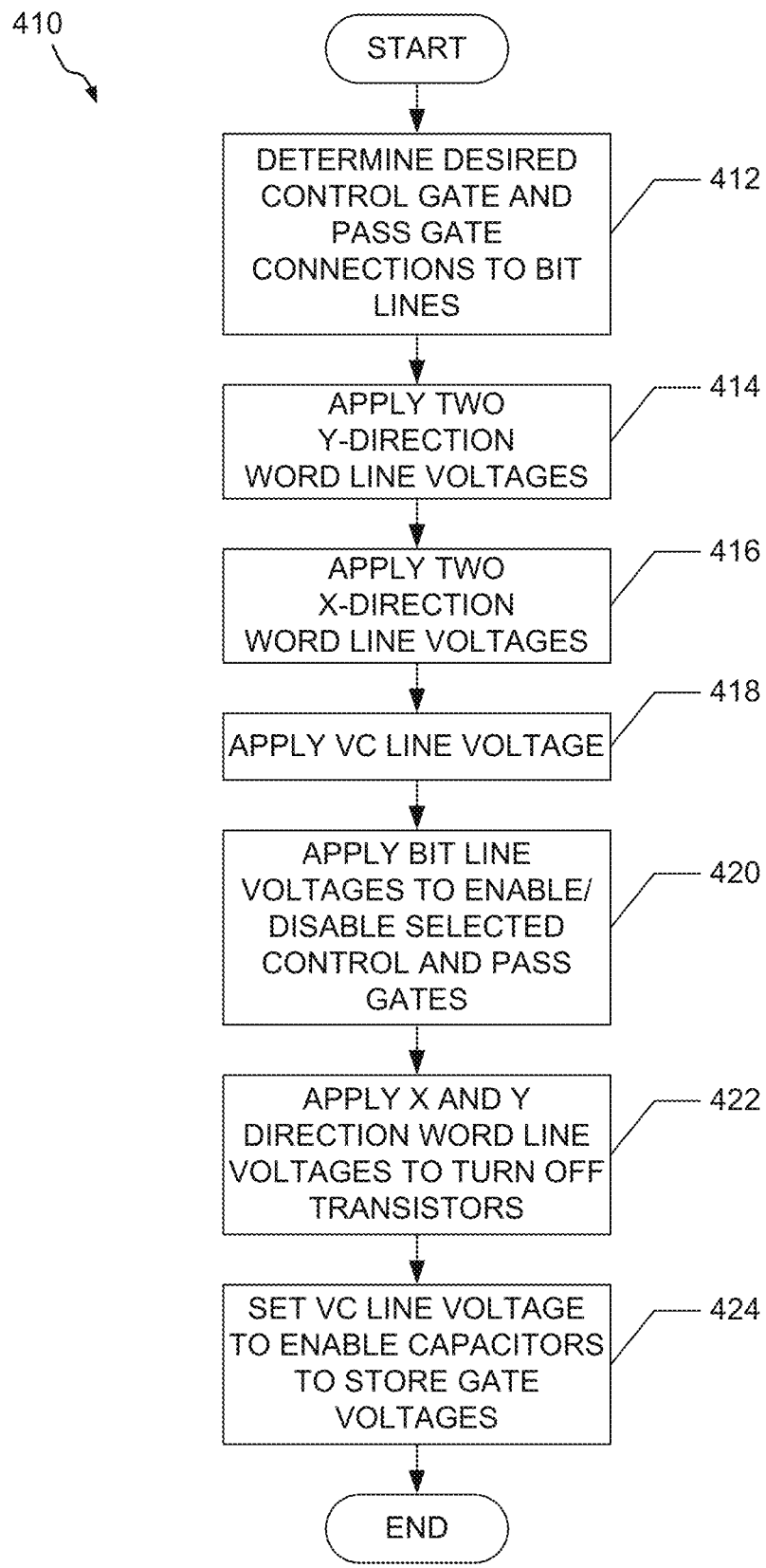
FIG. 4C shows an exemplary embodiment of a method for operating a qubit array.

FIG. 4C shows an exemplary embodiment of a method 410 for operating a qubit array. For example, the method 410 is suitable for use to operate the array 400 shown in FIG. 4A.

At block 412, a determination of the desired individual connections between the bits lines and the control and pass gates is made. For example, a determination is made as to which bit lines are to be connected to their corresponding control and pass gates.

At block 414, two Y-direction word line voltage are applied. For example, two voltages are applied to WLy1 112a and WLy2 112b, respectively, to enable current to flow through the transistors 107a-c to obtain the desired connections determined at block 412.

At block 416, two X-direction word line voltage are applied. For example, two voltages are applied to WLx1 113a and WLx2 113b, respectively, to enable current to flow through the transistors 107a-c to obtain the desired connections determined at block 412.

At block 418, a VC line voltage is applied. For example, a voltage is applied to VC 114 to enable current to flow through the transistors 107a-c.

At block 420, bit line voltages are applied to enable/disable the control gate 104 and pass gates 105/106 in accordance with the desired connections determined at block 412. For example, based on the settings of the WLy1, WLy2, WLx1, and WLx2 voltages, one or more of the bit lines 111a-c are connected to the corresponding control gate 104 and pass gates 105/106. Thus, the desired bit line voltages will be applied to those individually selected gates to control the operation of the qubit 101.

At block 422, the word lines WLy1, WLy2, WLx1, and WLx2 are supplied with voltages to turn off the transistors 107a-c.

At block 424, the VC line voltage is set to enable the capacitor to store the control gate 104 voltage and the pass gate 105/106 voltages. Thus, the bit line voltages applied to the control gate 104 and the pass gates 105/106 will be maintained.

Thus, the method 410 performs operations to individually control the control gate and pass gates of a qubit array. It should be noted that the operations of the method 410 could be combined, added to, deleted, rearranged, or otherwise modified within the scope of the embodiments.

Figure 5A:
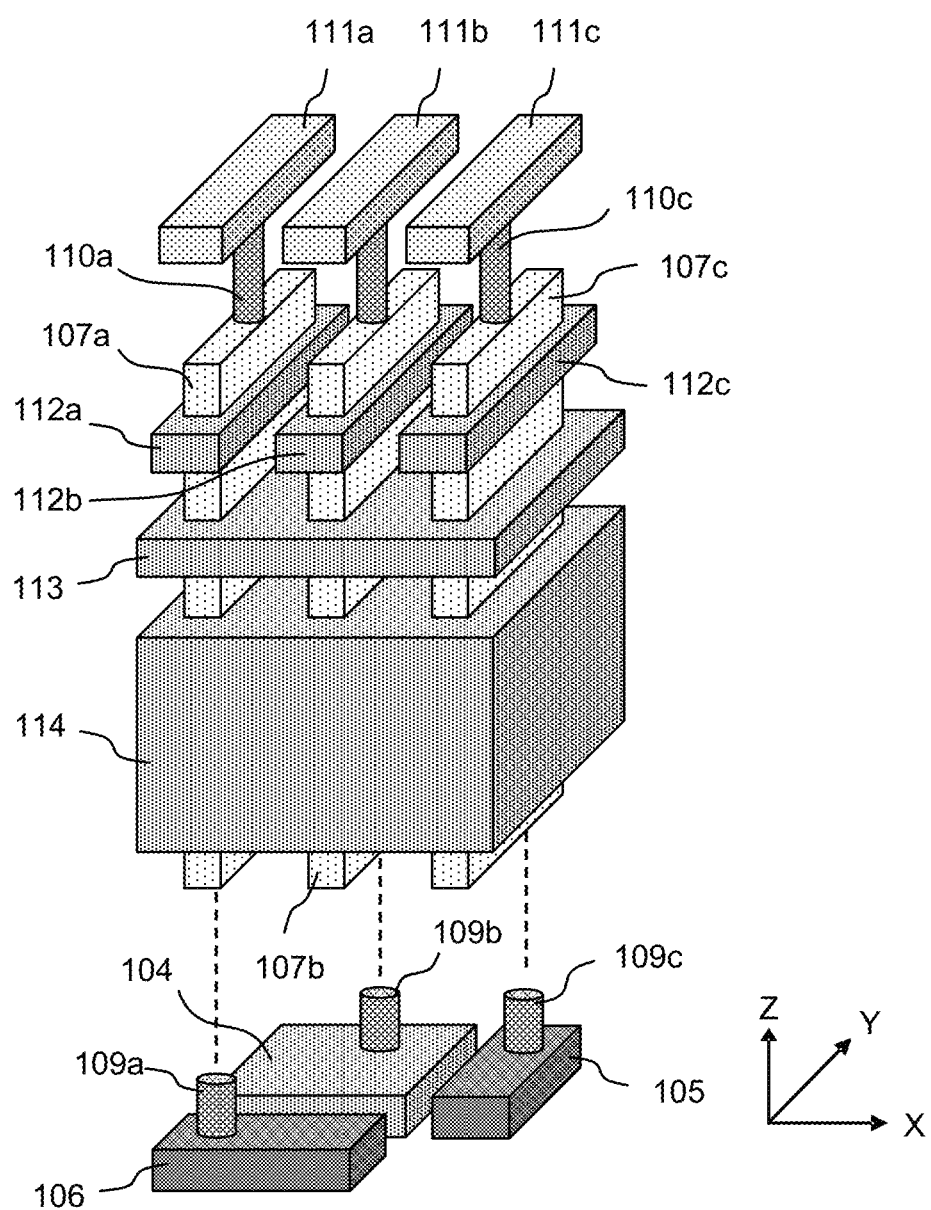
FIG. 5A shows another embodiment of a basic unit of a qubit array.

FIG. 5A shows another embodiment of a basic unit of a qubit array 500. Like the basic unit of the array 400, this embodiment can also connect one or multiple ones of the control gate and pass gates to their associated bit lines. This embodiment is similar to the embodiment shown in FIG. 2A except that it has three Y-direction word line conductors 112a-c instead of just one. The Y-direction word line conductors 112a-c provide individual control to connect one or multiple ones of the control gate and pass gates to their associated bit lines 111a-c.

Figure 5B:
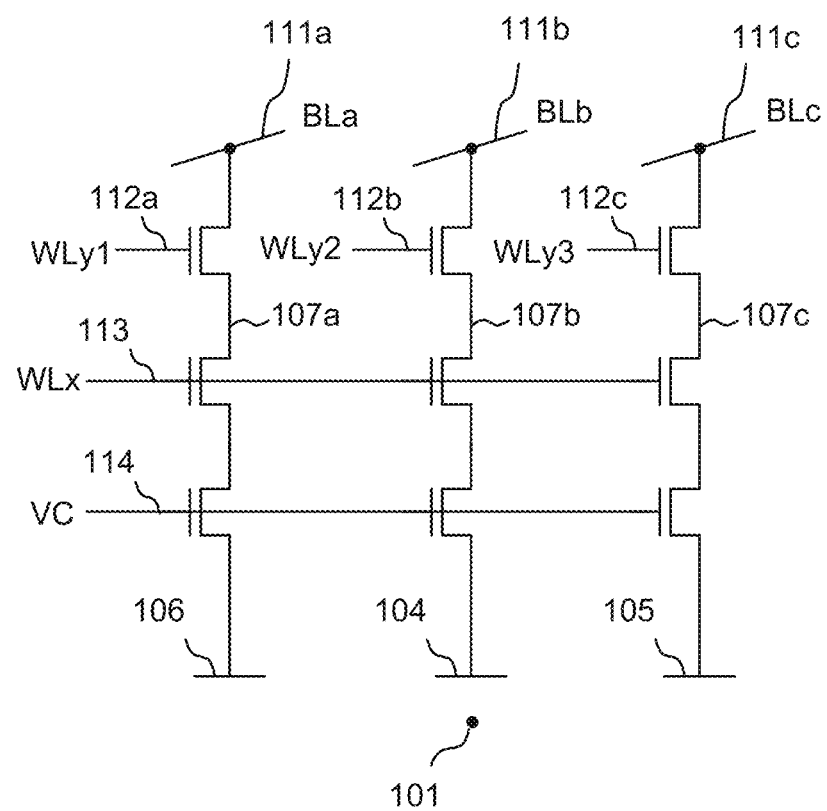
FIG. 5B shows the equivalent circuit of the basic unit shown in FIG. 5A.

FIG. 5B shows the equivalent circuit of the basic unit of the qubit array 500 shown in FIG. 5A. FIG. 5B illustrates the three word line conductors WLy1 112a, WLy2 112b, and WLy3 112c that operate to allow any combination of the control gate 104 and pass gates 105/106 to be selectively connected to their associated bit lines 111a-c.

In the embodiments of the qubit arrays shown in FIGS. 2A-5B the control gate and pass gates are connected to their associated bit lines through vertical transistors. In the embodiments described below, only the control gate 104 is connected to its bit line using a vertical transistor channel.

Figure 6:
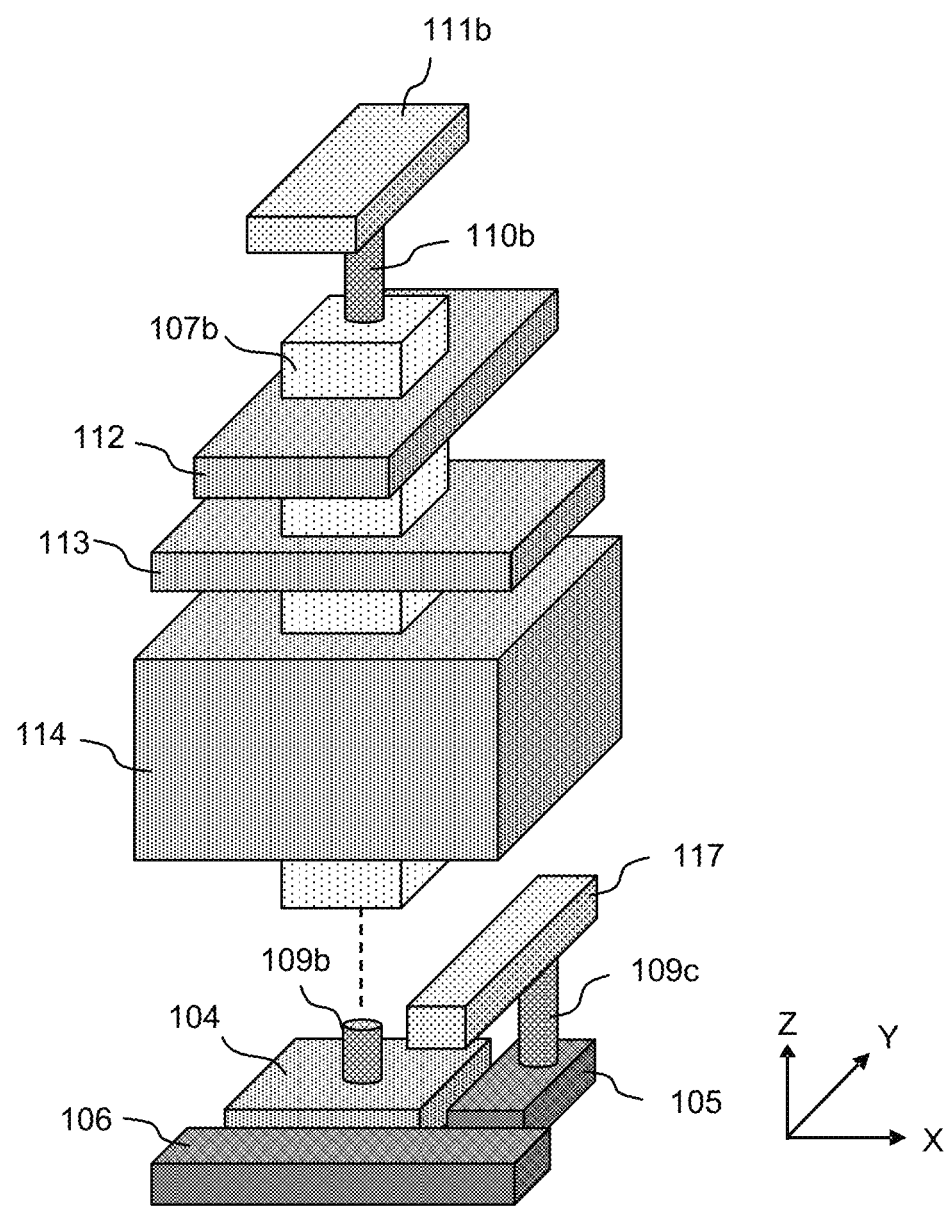
FIG. 6 shows another embodiment of a basic unit of a qubit array.

FIG. 6 shows another embodiment of a basic unit of a qubit array 600. In this embodiment, only the control gate 104 is connected to its associated bit line 111b through a vertical transistor 107b. The X-direction pass gate 105 and Y-direction pass gate 106 are directly connected to decoder circuits. In an embodiment, the pass gate 106 is directly connected to an adjacent unit's pass gate. The pass gate 105 is connected to adjacent unit's pass gate through the contact 109c and the metal line 117. Therefore, the pass gates of different units may not be randomly selected and set to different conditions. Instead, the pass gates are selected by decoders to perform row-select or column-select operations.

FIGS. 7A-E show additional embodiments of qubit arrays constructed in accordance with the invention.

Figure 7A:
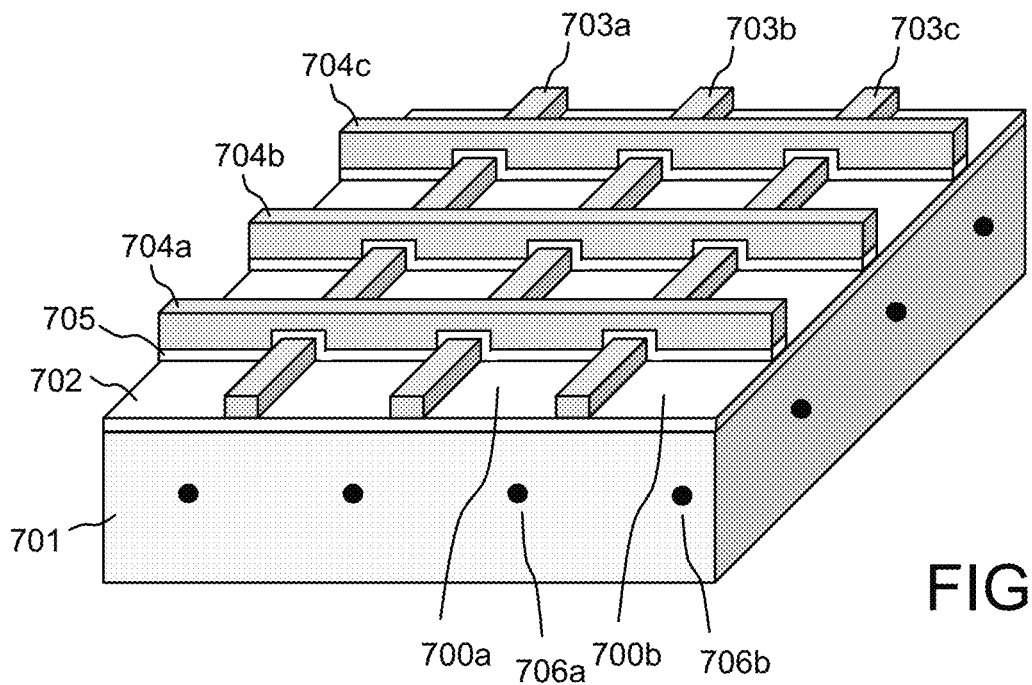
FIGS. 7A-E show additional embodiments of qubit arrays constructed in accordance with the invention.

FIG. 7A shows an exemplary embodiment of a lower layer structure of a qubit array. The lower layer structure comprises a substrate layer 701 that is formed from any suitable material, such as silicon (Si), silicon-germanium (SiGe), sapphire, diamond, or combination of multiple layers of above-mentioned materials.

On a top portion of the lower layer structure 701 is an insulating layer 702 or dielectric layer, such as oxide (SiO2), nitride, or hi-K material. Barrier gates 703a-c and 704a-c are formed from conductor material, such as metal, polysilicon, micro-magnet, or superconductor material. The barrier gates 704a-c are separated from the barrier gates 703a-c by an insulator 705 or dielectric layer, comprising material such as oxide, nitride, or hi-K material. The barrier gates 703a-c and 704a-c run in different directions to form an array of grid regions, such as grid regions 700a and 700b.

A qubit is located under each grid region. For example, the qubit 706a is located in the substrate 701 under the grid region 700a, and the qubit 706b is located in the substrate 701 under the grid region 700b. The qubits are implanted inside the substrate layer 701 using any suitable technology, such as atoms, ions, photons, nucleus, or electrons. In an exemplary embodiment, the qubits are the electrons and nucleus of a single phosphorus atom.

For illustration purposes, the barrier gates 703a-c and 704a-c are referred to herein as 'X lines' and 'Y-lines', respectively. By applying a first selected voltage to the X lines or Y lines, the electric potential of the substrate 701 under the barrier gates creates a potential barrier to prevent adjacent qubits to 'entangle' or 'shuttle'. On the other hand, by applying a second selected voltage or RF magnetic field to the X lines and Y lines, an electric potential or magnetic field is created to allow the adjacent qubits to entangle or shuttle. By using this process, quantum logic calculations using the qubits can be performed.

Figure 7B:
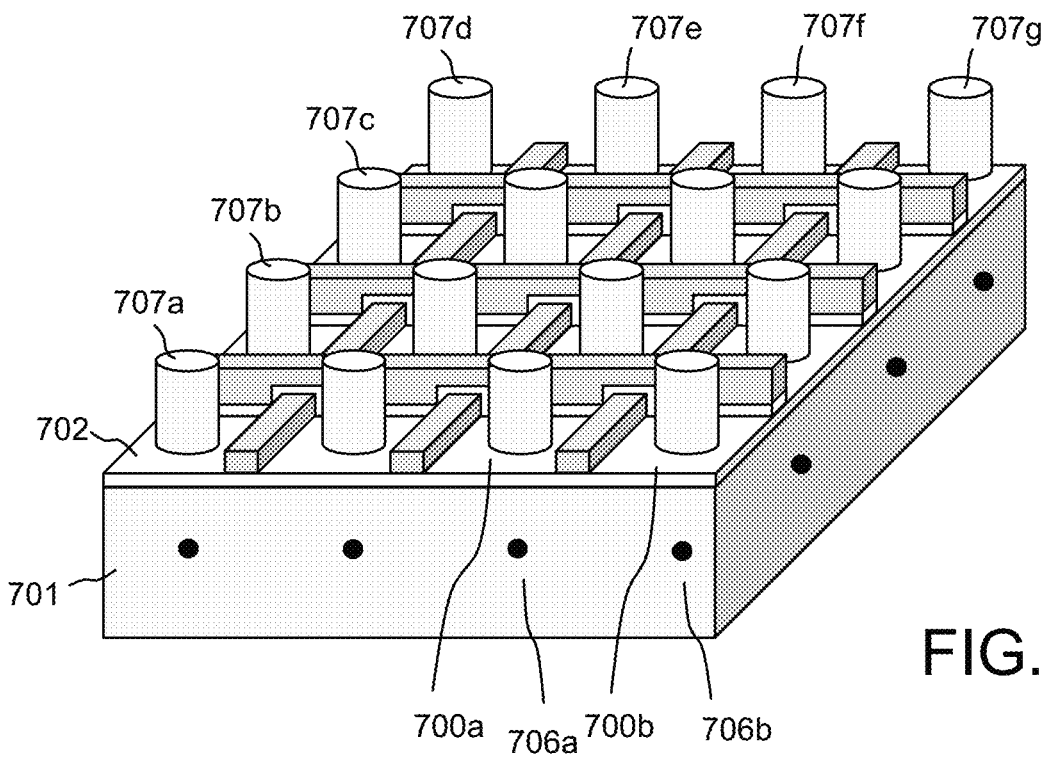

FIG. 7B shows an exemplary embodiment of upper layer structures added to the qubit array shown in FIG. 7A. This embodiment includes control gates, such as control gates 707a-g, that are formed on top of the grid regions. The control gates 707 comprise a suitable conductor, such as metal, polysilicon, micro-magnet, or superconductor. By applying the appropriate voltage or RF magnetic field to the control gates 707, the electric field under the gates pulls electrons of the qubits toward the gates or push electrons of the qubits away from the gates to initialize or store the spin state of the qubits. For a read out, the control gates 707 can be connected to sensing circuits, such as resonator circuit to sense the spin state of the qubits.

Figure 7C:
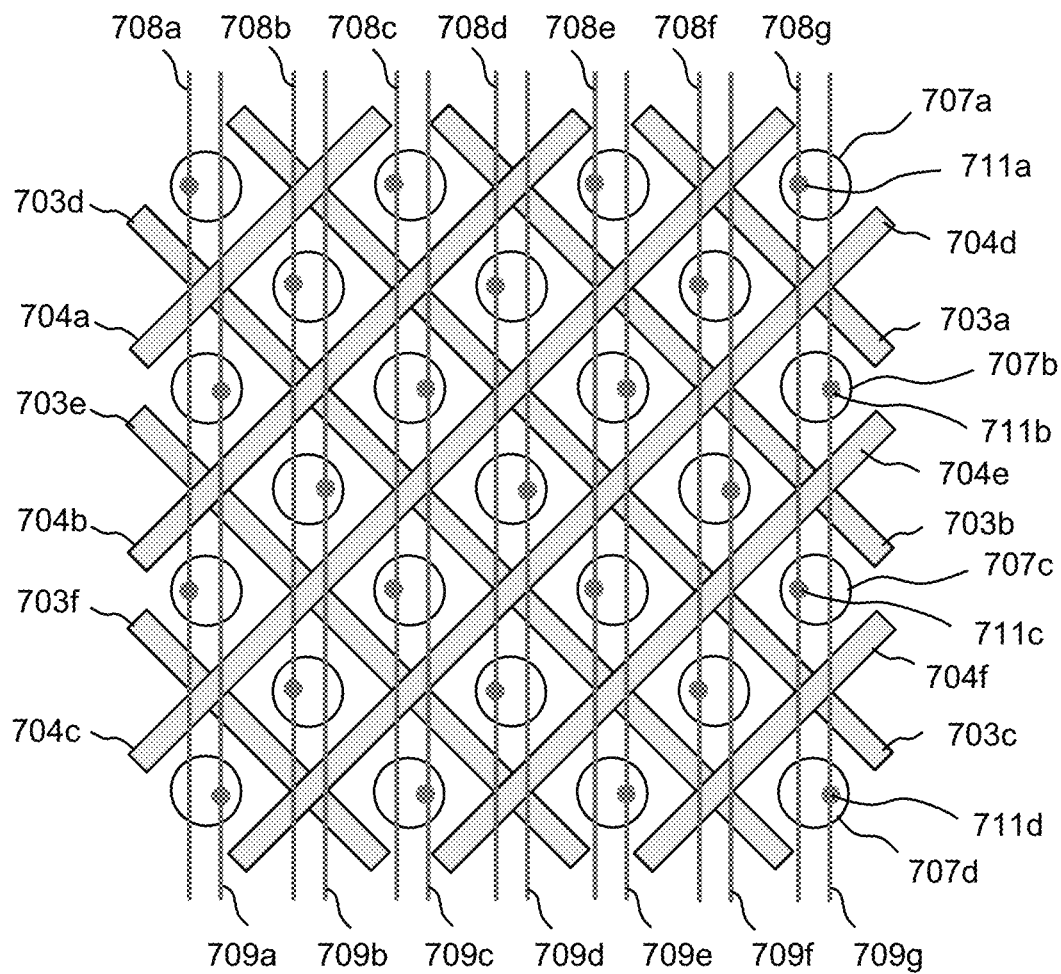

FIG. 7C shows a top view of the array shown in FIG. 7B and includes an exemplary embodiment of top layer connections. Illustrated in FIG. 7C are X-lines 703a-f, Y-lines 704a-f, and control gates 707, such as control gates 707a-d that are located on top of the qubits. The control gates 707 are connected to conductor lines 708a-g and 709a-g through contacts 711, such as contacts 711a-d. The conductor lines 708a-g and 709a-g are referred to as "data lines." The data lines are formed from a suitable conductor, such as metal, polysilicon, micro-magnet, or superconductor. In an embodiment, the contacts 711, such as contacts 711a-d, are staggered to provide for even and odd data lines, such as illustrated by the alternating connections of the data line 708g and data line 709g to the control gates 707a-d.

Figure 7D:
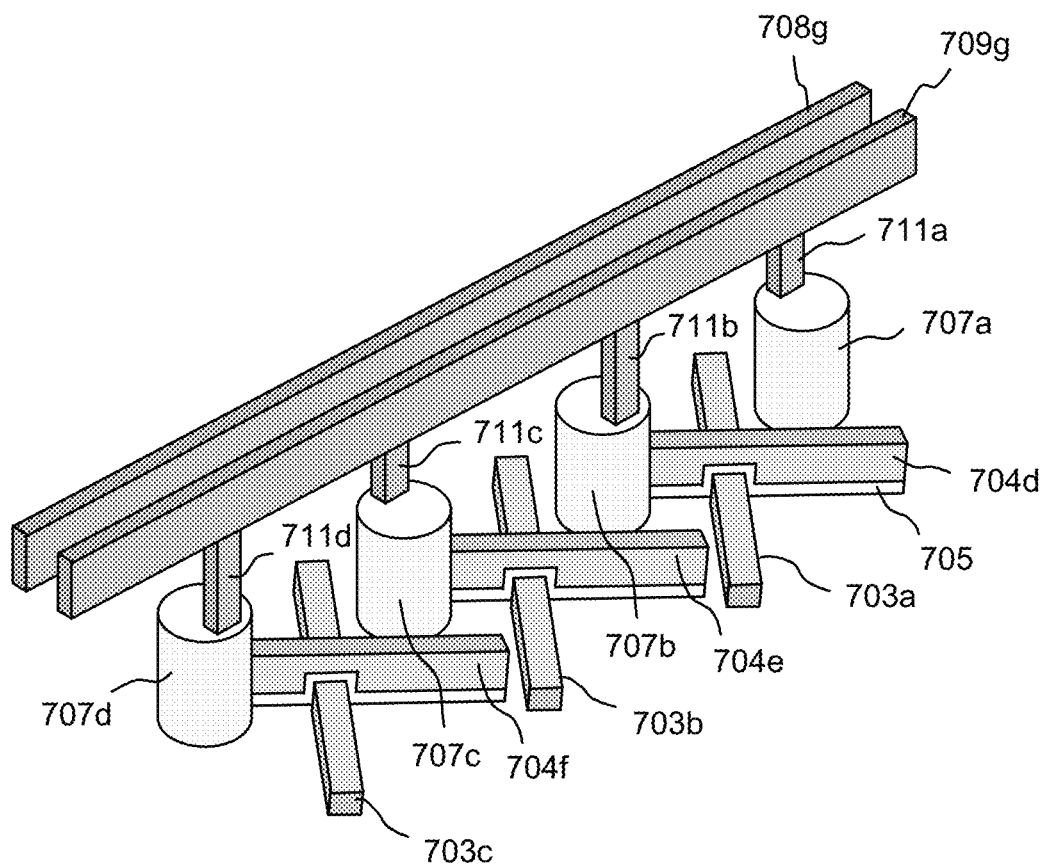

FIG. 7D shows an exemplary three-dimensional (3D) representation of the qubit array structure shown in FIG. 7C. The 3D representation is taken along the data lines 708a and 709g. It should be noted that the contacts 711a-d are staggered to connect the data lines 708g and 709g to the control gates 707a-d in an alternating fashion.

Figure 7E:
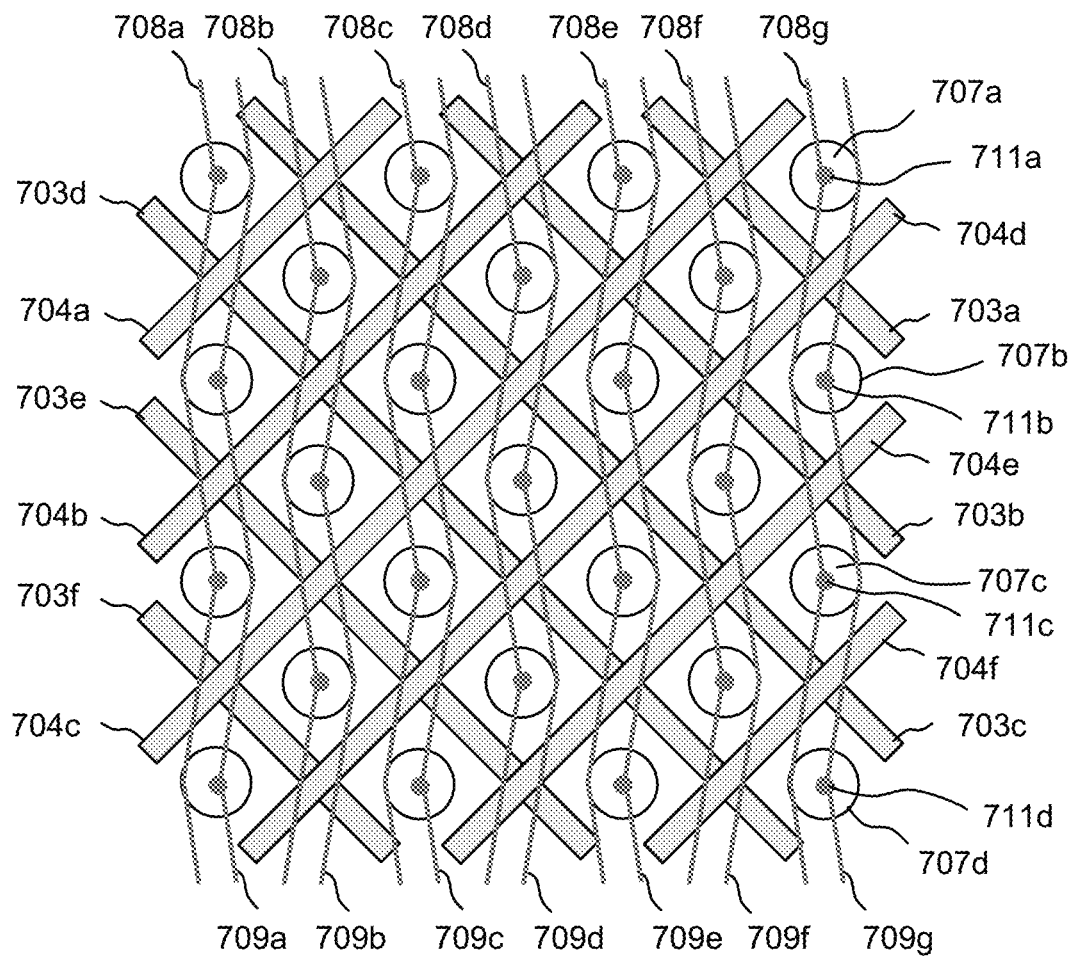

FIG. 7E shows a top view of the array shown in FIG. 7B and includes an exemplary embodiment of top layer connections. As shown in FIG. 7E, the data lines 708a-g 709a-g are constructed to form a zigzag pattern. The zig-zag pattern allows even and odd data lines, such as 708g and 709g, to connect to the control gates 707a-d in an alternating fashion.

FIGS. 8A-D show exemplary operations of the qubit array shown in FIG. 7C.

Figure 8A:
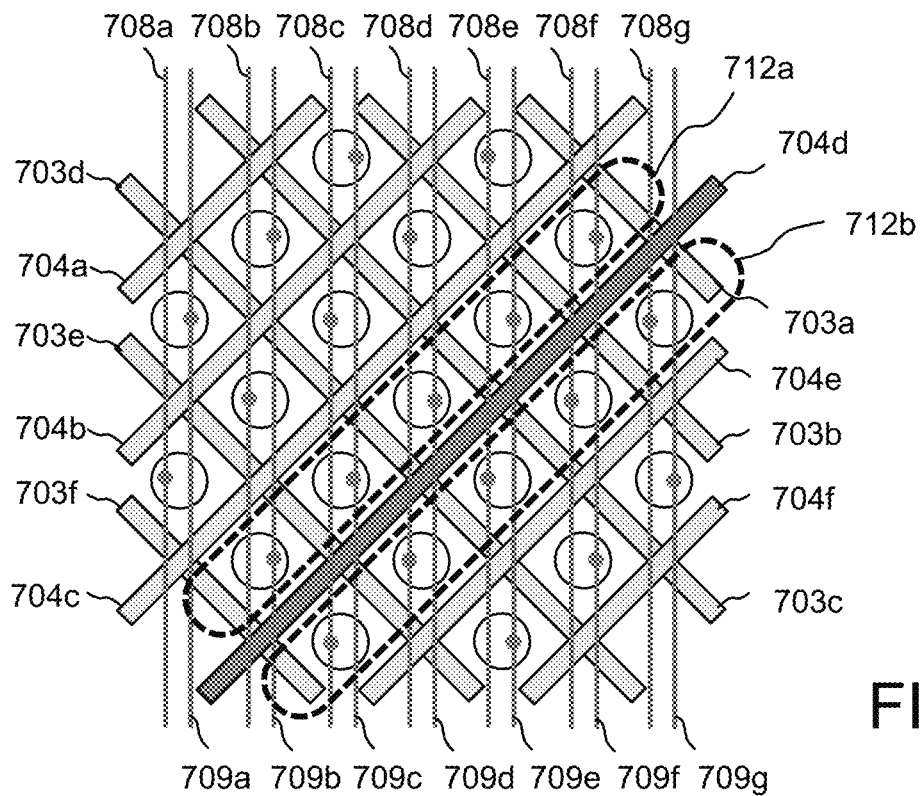
FIGS. 8A-D show exemplary operations of the qubit array shown in FIG. 7C.

FIG. 8A illustrates how a voltage can be applied to a selected Y-line to enable quantum logic operations. In an embodiment, a selected Y-line 704d is supplied with a selected voltage or RF magnetic field to allow the qubits in the groups 712a and 712b to be entangled, shuttled, or to perform other quantum logic operations. Meanwhile, the other unselected Y-lines and X-lines are supplied with another voltage or RF magnetic field to form potential barriers under the gates to isolate the qubits. By using the disclosed array structure, each qubit in the groups 712a and 712b is connected to one individual data line. For example, each of the qubits in the group 712a are connected to one data line in a first group of data lines 709b-f, and each of the qubits in the group 712b are connected to one data line in the second group of data lines 708c-g. Each data line may be supplied with the proper voltage conditions or connected to another circuit. This allows all the qubits in the groups 712a and 712b to perform quantum logic operation together. This significantly enhances the performance of the quantum computer.

Figure 8B:
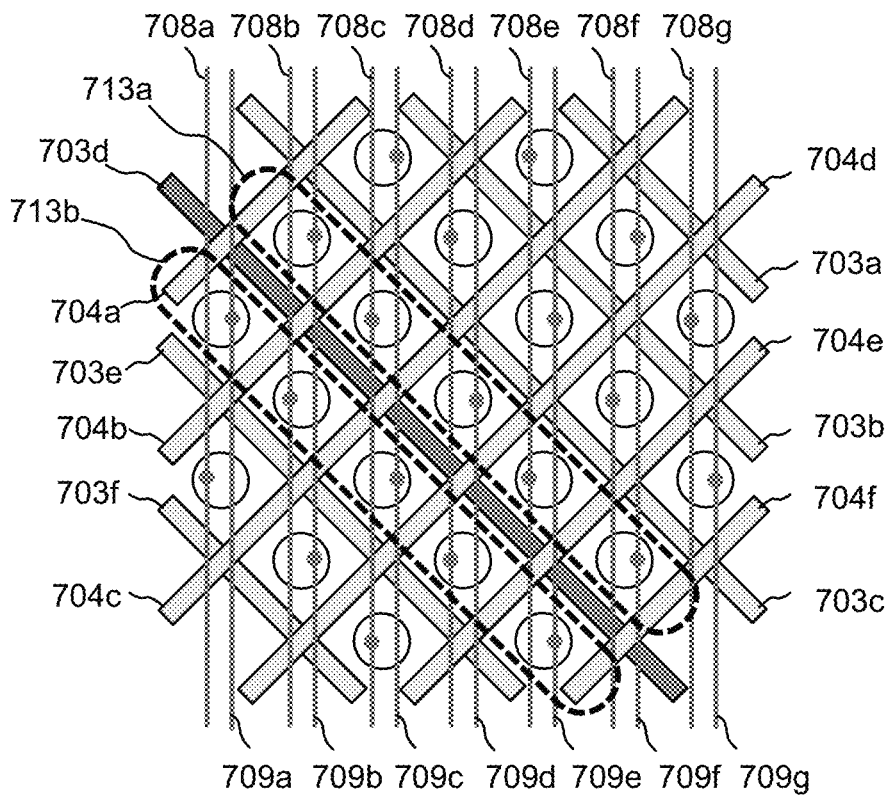

FIG. 8B illustrates how a voltage can be applied to a selected X-lines to enable quantum logic operations. In an embodiment, a selected X-line 703d is supplied with a selected voltage or RF magnetic field to allow the qubits in the groups 713a and 713b to be entangled, shuttled, or to perform other operations. Meanwhile, the other unselected Y-lines and X-lines are supplied with another voltage or RF magnetic field to form potential barriers under the gates to isolate the qubits. By using the disclosed array structure, each qubit in the groups 713a and 713b is connected to one individual data line. This allows all the qubits in the groups 713a and 713b to perform operation together. This significantly enhances the performance of the quantum computer.

Figure 8C:
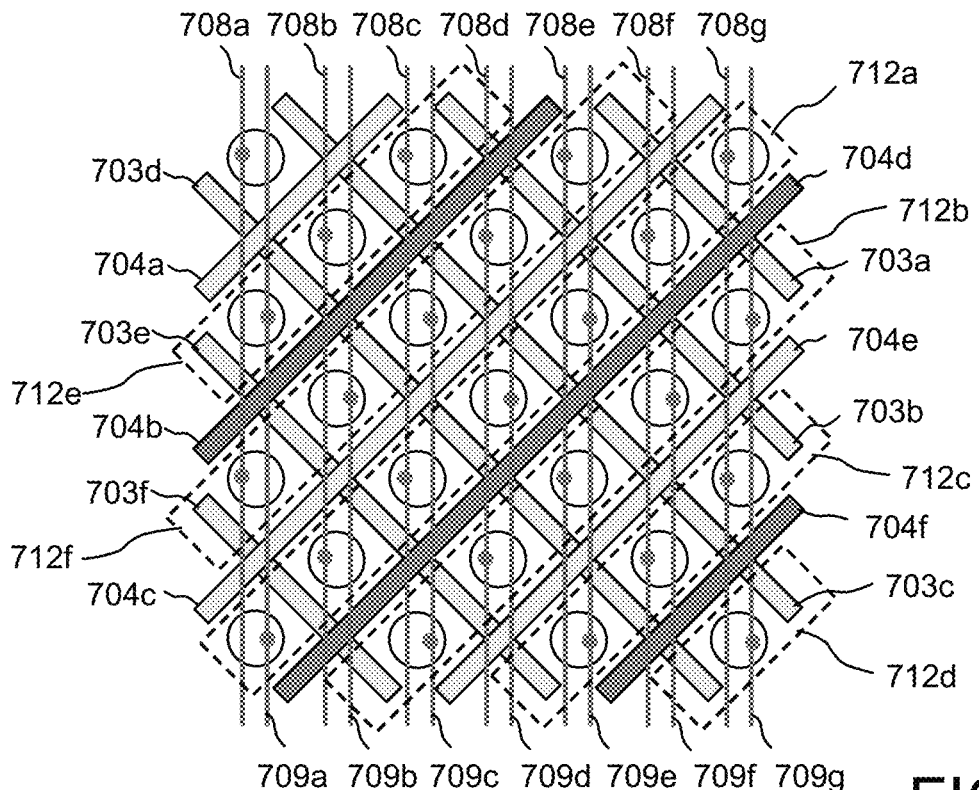

FIG. 8C illustrates how a voltage can be applied to multiple Y-lines to enable quantum logic operations. In an embodiment, multiple selected Y-lines, such as Y-lines 704b, 704d, and 704f are supplied with a selected voltage or RF magnetic field to allow the qubits in each of the groups (712a/712b, 712c/712d, and 712e/712f) to be entangled, shuttled, or to perform other operations. Meanwhile, the other unselected Y-lines and X-lines are supplied with another voltage to form barriers under the gates to isolate the qubits.

Figure 8D:
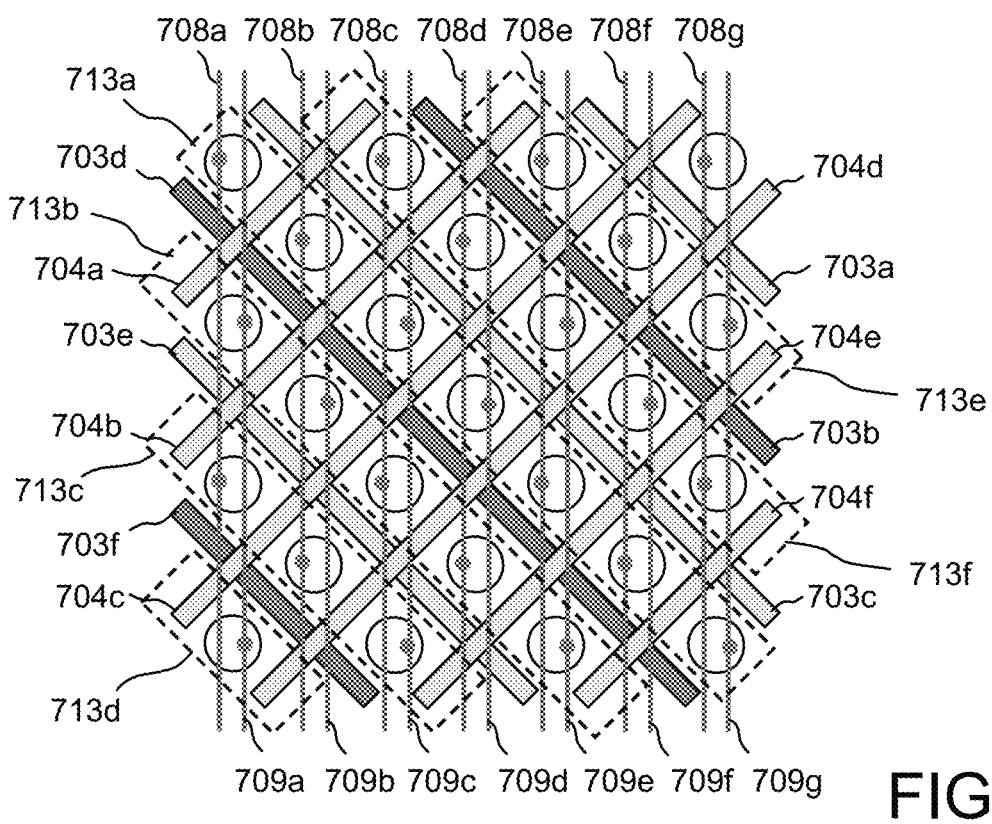

FIG. 8D illustrates how a voltage can be applied to multiple X-lines to enable quantum logic operations. In an embodiment, multiple selected X-lines, such as X-lines 703b, 703d, and 703f are supplied with a proper voltage or RF magnetic field to enable the qubits in each of the groups (713a/713b, 713c/713d, and 713e/713f) to be entangled, shuttled, or to perform other operations. Meanwhile, the other unselected Y-lines and X-lines are supplied with another voltage to form barriers under the gates to isolate the qubits.

It should also be noted that although the embodiment of the qubit array shown in FIG. 7C shows two groups of data lines 708a-g and 709a-g connected to the control gates in an alternating fashion, in other embodiments, the data lines are separated into any number of groups, such as into three, four, or more groups.

Figure 9A:
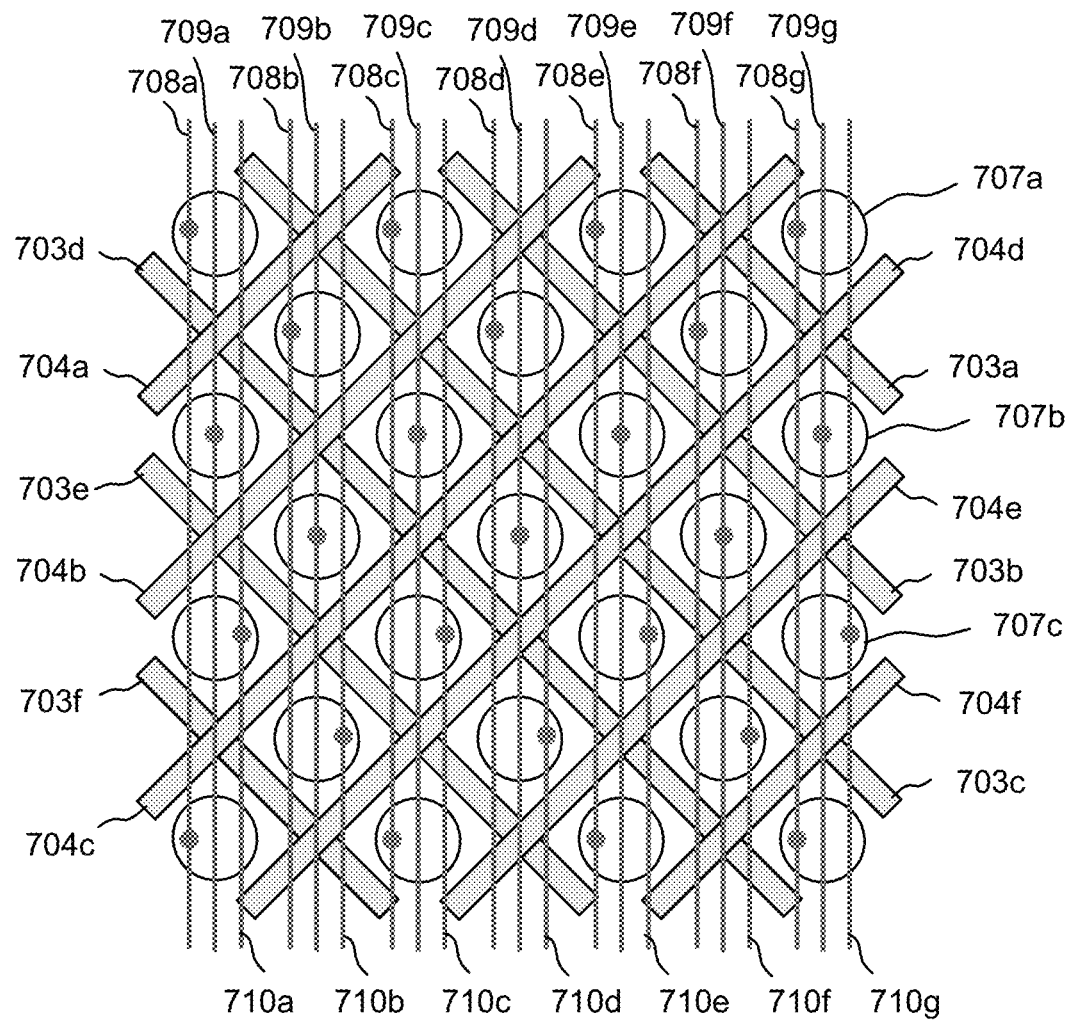
FIG. 9A shows an exemplary embodiment of a qubit array that uses three groups of data lines.

FIG. 9A shows an exemplary embodiment of a qubit array that uses three groups of data lines. For example, the array includes a first group of data lines 708a-g, a second group of data lines 709a-g, and a third group of data lines 710a-g. The three groups of data lines are connected to the control gates 707 in an alternating fashion. For example, the data lines 708g, 709g, and 710g are connected to the control gates 707a, 707b, and 707c in an alternating fashion.

Figure 9B:
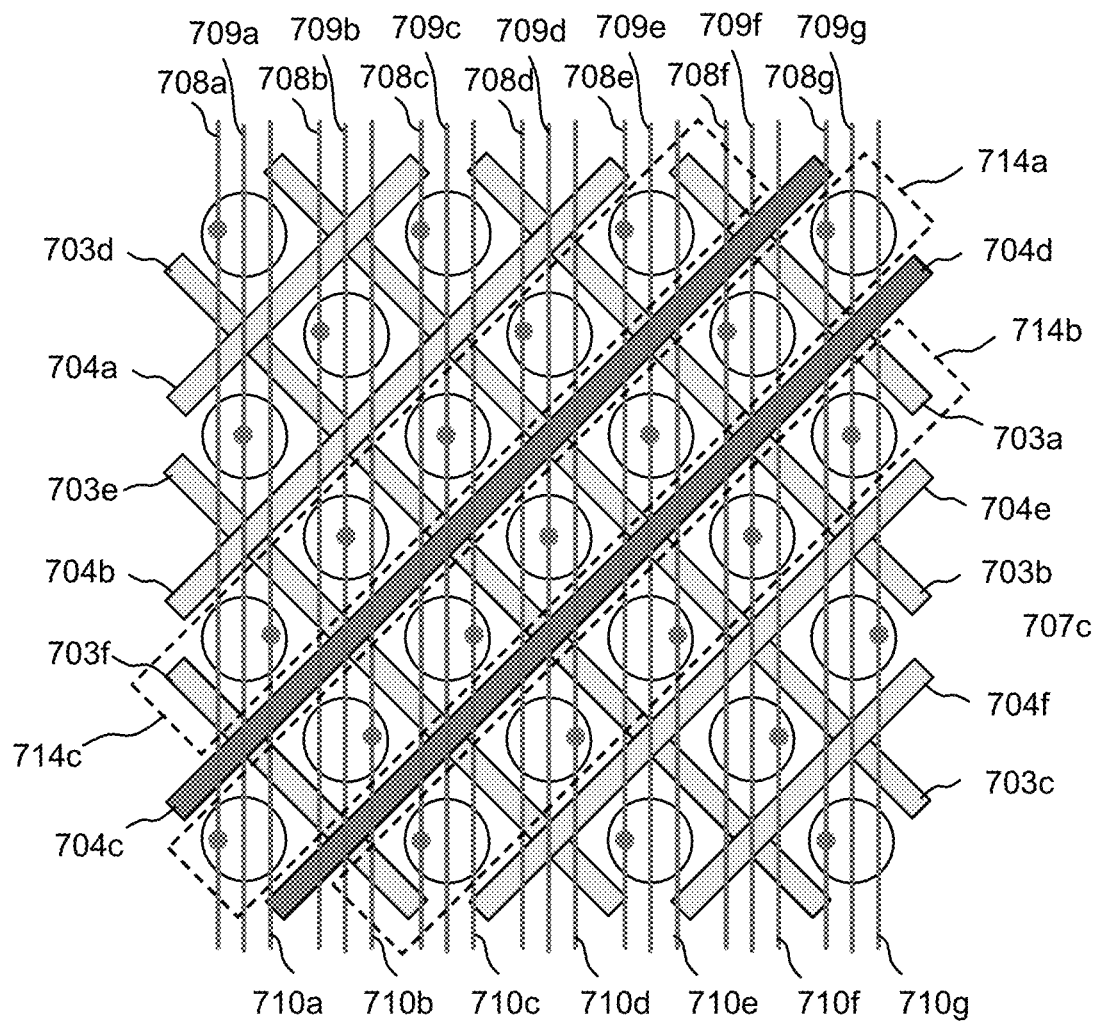
FIG. 9B shows an exemplary embodiment of a qubit array that allows three groups of qubits to be entangled, shuttled, or controlled to perform other operations together.

The array shown in FIG. 9A allows three groups of qubits to be entangled, shuttled, or to controlled to perform other operations together, as described with respect to FIG. 9B.

FIG. 9B shows an exemplary embodiment of a qubit array that allows three groups of qubits to be entangled, shuttled, or to controlled to perform other operations together. In an embodiment, two Y-lines 704c and 704d are supplied with a proper voltage or RF magnetic field to entangle the qubits in the groups 714a, 714b, and 714c. Each qubit in the groups 714a, 714b, and 714c is connected to one individual data line. This allows the data lines to be supplied with the proper conditions or connected to circuits to allow the qubits in the groups 714a, 714b, and 714c to be entangled, shuttled, or configured to perform other quantum logic operations together.

Figure 10A:
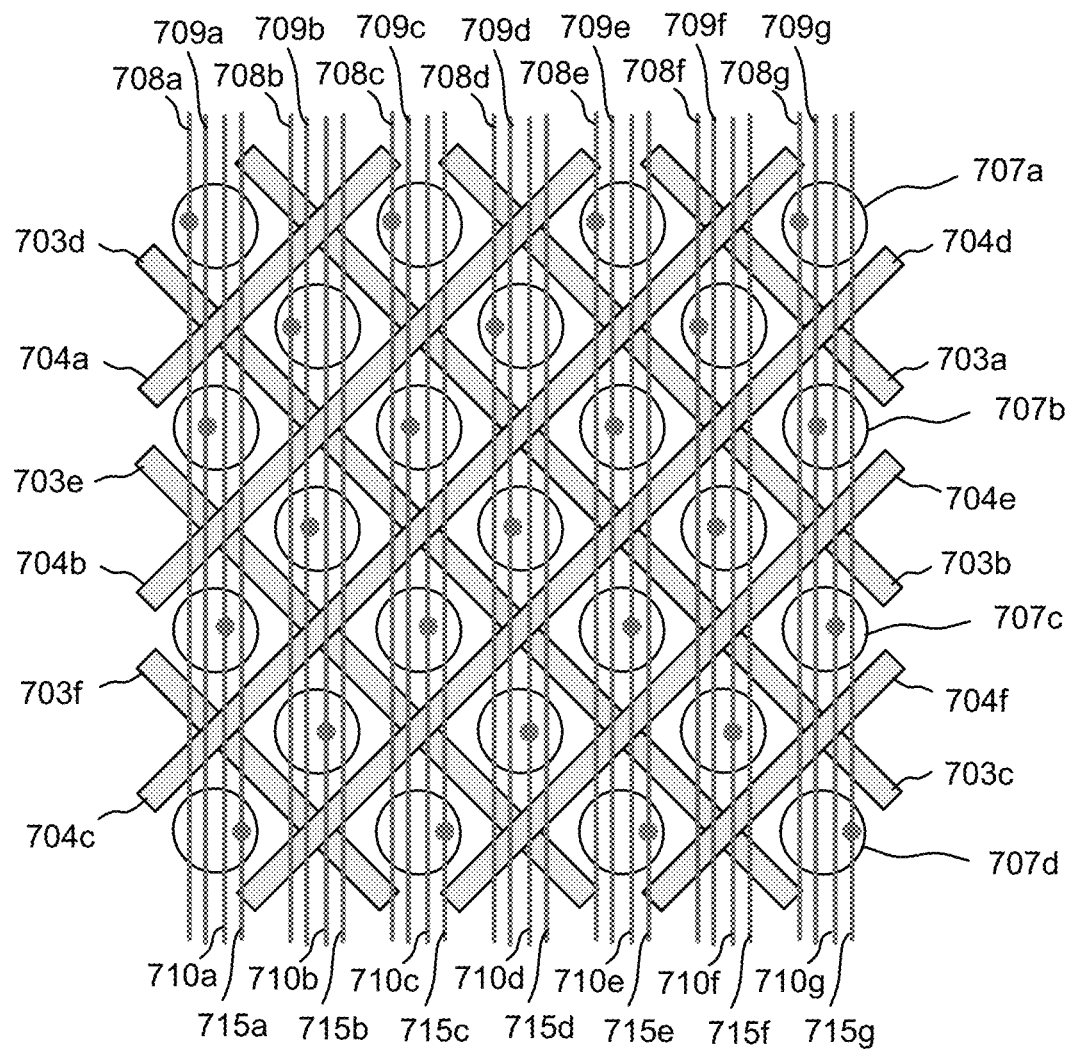
FIG. 10A shows an exemplary embodiment of a qubit array that uses four groups of data lines.

FIG. 10A shows an exemplary embodiment of a qubit array that uses four groups of data lines. For example, the array includes a first group of data lines 708a-g, a second group of data lines 709a-g, a third group of data lines 710a-g, and a fourth group of data lines 715a-g. In this embodiment, the four groups of data lines are connected to the control gates 707 in an alternating fashion as illustrated in FIG. 10A.

Similar to the array shown in FIG. 9B, the array shown in FIG. 10A allows four groups of qubits to perform entangle, shuttle, and other quantum logic operations together.

In accordance with embodiments of the invention, the number of the groups of data lines to be alternately connected to the control gates is not limited. It is dependent on the pitch of the data lines and the pitch of the qubits. For example, assuming the qubit pitch is 100 nm, if the data line pitch is 50 nm, the dual group of data lines as shown in FIG. 7C can be implemented. If the data line pitch is 30 nm, the triple groups of data lines as shown in FIG. 9A can be implemented. If the data line pitch is 25 nm, the triple groups of data lines as shown in FIG. 10A can be implemented. The smaller pitch between the data lines, or the larger qubit pitch is, the more groups of the data lines can be implemented.

Figure 10B:
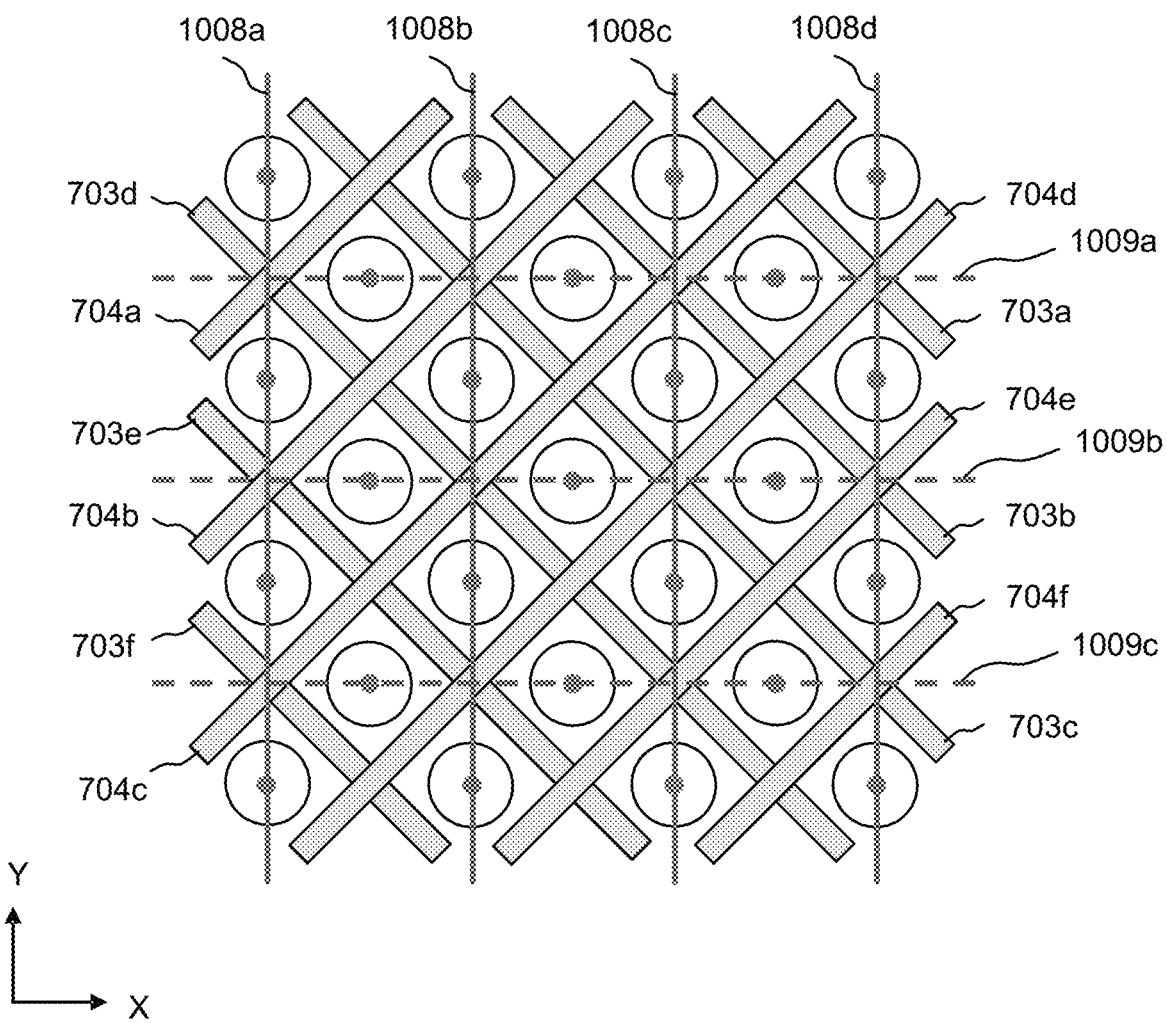
FIG. 10B show another embodiment of a qubit array constructed in accordance with the invention.

FIG. 10B show another embodiment of a qubit array constructed in accordance with the invention. In this embodiment, the array includes multiple groups of data lines that are running in different directions. For example, the first group of data lines 1008a-d run in the Y direction and a second group of data lines 1009a-c run in the X direction, as shown. In this embodiment, the data lines 1008a-d are formed as a first layer of conductors, and the data lines 1009a-c are formed as a second layer of conductors.

Figure 10C:
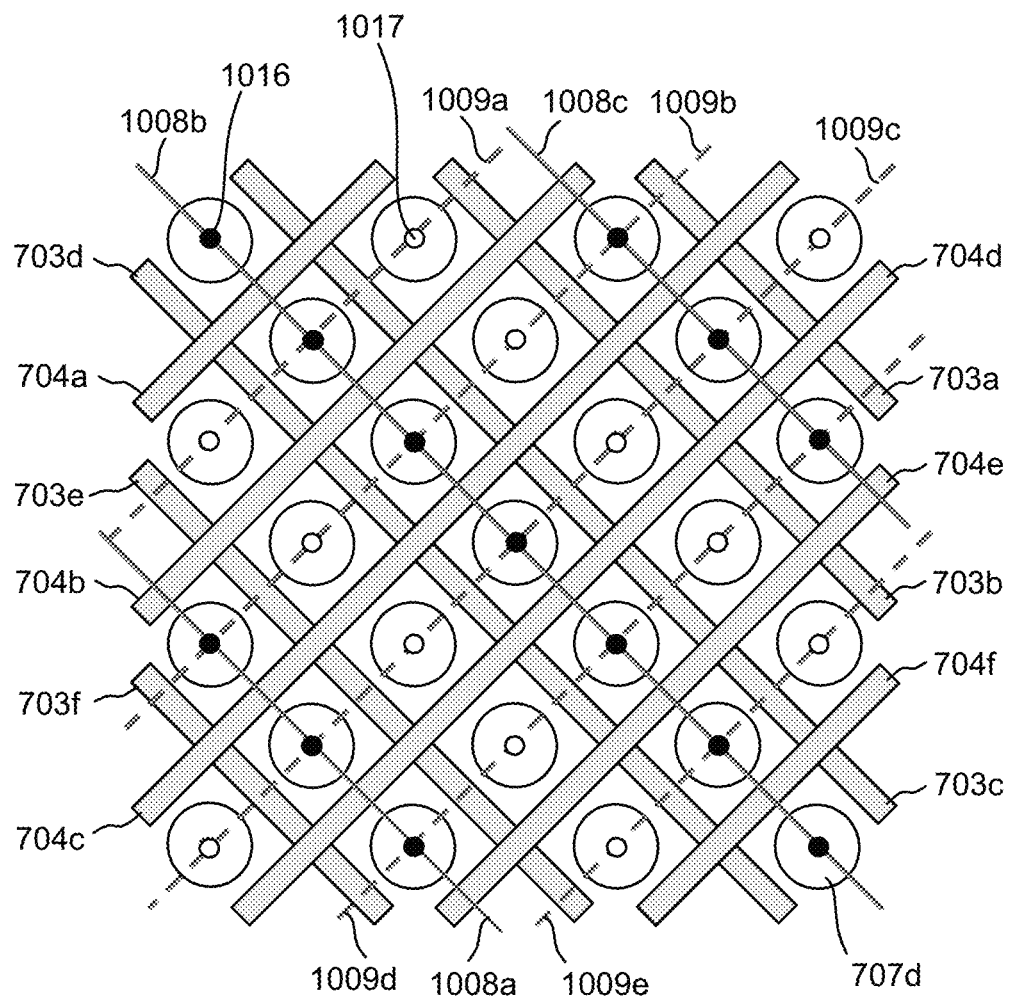
FIG. 10C show another embodiment of a qubit array constructed in accordance with the invention.

FIG. 10C show another embodiment of a qubit array constructed in accordance with the invention. In this embodiment, the array includes multiple groups of data lines running in different directions. For example, a first group of data lines 1008a-d runs in the same direction as the X-lines 703a-f. A second group of data lines 1009a-e runs in the same direction as the Y-lines 704a-f. In an embodiment, the data lines 1008a-c are formed by a first layer of conductors, and the data lines 1009a-e are formed by a second layer of conductors. The black dots, such as black dot 1016, represent a contact or via that connect the first layer conductor lines 1008a-c to the control gates. The white dots, such as white dot 1017, represent a contact or via that connect the second layer conductor lines 1009a-e to the control gates 707. By using the disclosed qubit array structures and methods, high-density, high-performance quantum computers can be realized.

While exemplary embodiments of the present invention have been shown and described, it will be obvious to those with ordinary skills in the art that based upon the teachings herein, changes and modifications may be made without departing from the exemplary embodiments and their broader aspects. Therefore, the appended claims are intended to encompass within their scope all such changes and modifications as are within the true spirit and scope of the exemplary embodiments of the present invention.

What is claimed is:

1. A quantum bit array comprising:
   a substrate layer;
   an insulating layer on top of the substrate layer;
   barrier gates on top of the insulating layer forming an array of grid regions, wherein the barrier gates comprise a first set of barrier gates in a first direction and a second set of barrier gates in a second direction that overlap the first set of barrier gates, and wherein the barrier gates are separated by insulating portions;
   control gates formed on the insulating layer, wherein a selected control gate is formed within each grid region; and
   a qubit located under each grid region.

2. The quantum bit array of claim 1, wherein the first set of barrier gates form X-lines and the second set of barrier gates for Y-lines, and wherein by applying a first selected voltage to the X-lines or Y-lines, a first electric potential of the substrate layer under the barrier gates creates a barrier to prevent adjacent qubits to 'entangle' or 'shuttle'.

3. The quantum bit array of claim 2, wherein by applying a second selected voltage or RF magnetic field to the X-lines and Y-lines, a second electric potential or magnetic field is created to allow the adjacent qubits to entangle or shuttle.

4. The quantum bit array of claim 3, wherein by applying a third selected voltage or RF magnetic field to the control gates, an electric field under the control gates pulls electrons of the qubits toward the control gates or pushes electrons of the qubits away from the control gates to initialize or store a spin state of the qubits.

5. The quantum bit array of claim 1, further comprising:
   contacts on top of the control gates; and
   conductor lines connected to the contacts to form data lines.

6. The quantum bit array of claim 5, wherein the contacts are staggered from one control gate to the next so that the conductor lines form even and odd data lines.

7. The quantum bit array of claim 5, wherein the contacts are centered on the control gates and the conductor lines are configured in a zig-zag pattern to form even and odd data lines.

8. The quantum bit array of claim 1, wherein the control gates and the barrier gates comprise conductor material.

* * * * *